US009495031B2

(12) United States Patent  (10) Patent No.: US 9,495,031 B2
Omoto  (45) Date of Patent: Nov. 15, 2016

(54) DISPLAY PANEL, DISPLAY DEVICE AND ELECTRONIC APPARATUS

(75) Inventor: Keisuke Omoto, Kanagawa (JP)

(73) Assignee: JOLED INC., Tokyo (JP)

( * ) Notice: Subject to any disclaimer, the term of this patent is extended or adjusted under 35 U.S.C. 154(b) by 182 days.

(21) Appl. No.: 13/415,617

(22) Filed: Mar. 8, 2012

(65) Prior Publication Data

US 2012/0249401 A1 Oct. 4, 2012

(30) Foreign Application Priority Data

Mar. 29, 2011 (JP) ................................. 2011-073076

(51) Int. Cl.
| G09G 3/3275 | (2016.01) |
| G06F 3/044 | (2006.01) |
| G09G 3/3233 | (2016.01) |
| G06F 3/041 | (2006.01) |
| H01L 27/32 | (2006.01) |
| G09G 3/32 | (2016.01) |

(52) U.S. Cl.
CPC ............. *G06F 3/0412* (2013.01); *G06F 3/044* (2013.01); *G09G 3/3225* (2013.01); *G09G 3/3233* (2013.01); *H01L 27/323* (2013.01); *H01L 27/3276* (2013.01); *G09G 3/3275* (2013.01); *G09G 2320/045* (2013.01)

(58) Field of Classification Search
CPC .......................... G09G 3/3208; G09G 3/3275
USPC ....................................................... 345/173
See application file for complete search history.

(56) References Cited

U.S. PATENT DOCUMENTS

| 2003/0122794 | A1* | 7/2003 | Caldwell ................ A47B 57/00 345/173 |
| 2006/0221002 | A1* | 10/2006 | Cho ......................... G09G 3/22 345/75.2 |
| 2008/0084405 | A1* | 4/2008 | Ushiyama ............... G02B 5/201 345/204 |
| 2008/0211395 | A1 | 9/2008 | Koshihara et al. |
| 2009/0322702 | A1* | 12/2009 | Chien ..................... G06F 3/044 345/174 |
| 2010/0123667 | A1* | 5/2010 | Kim ........................ G06F 3/044 345/173 |
| 2010/0253614 | A1* | 10/2010 | Chen ........................ G01J 1/32 345/102 |
| 2011/0175835 | A1* | 7/2011 | Wang ...................... G06F 3/044 345/173 |
| 2012/0044190 | A1* | 2/2012 | Yilmaz ................. G06F 3/0412 345/174 |

FOREIGN PATENT DOCUMENTS

JP 2008-083272 4/2008

* cited by examiner

*Primary Examiner* — Srilakshmi K Kumar
*Assistant Examiner* — Carl Adams
(74) *Attorney, Agent, or Firm* — Sheridan Ross P.C.

(57) ABSTRACT

A display panel includes: plural display pixels arranged in a matrix state, wherein each display pixel includes an organic EL device and a pixel circuit driving the organic EL device, the organic EL device is formed by stacking a first electrode connected to the pixel circuit, a light emitting layer and a second electrode, and the second electrode is a strip electrode shared by plural organic EL devices arranged in a row direction or in a column direction.

10 Claims, 16 Drawing Sheets

FIG.11
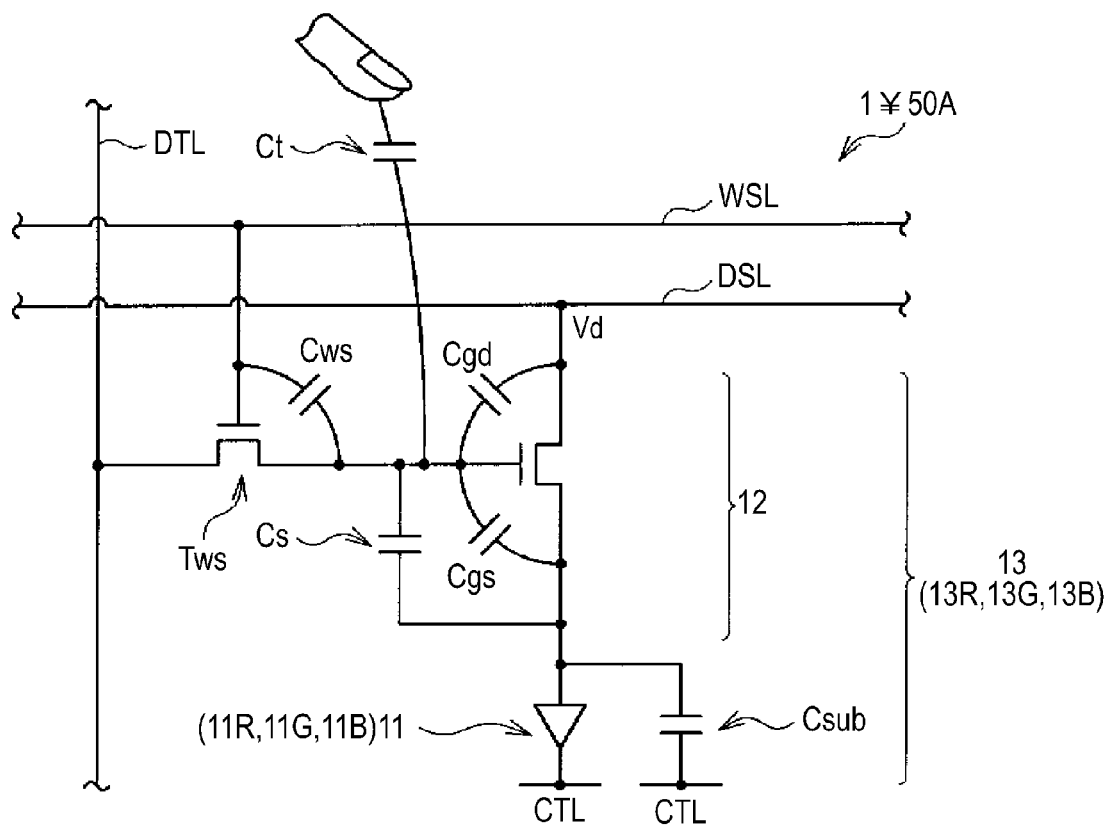
FIG.12A WSL
FIG.12B GATE VOLTAGE Vg
FIG.12C SOURCE VOLTAGE Vs
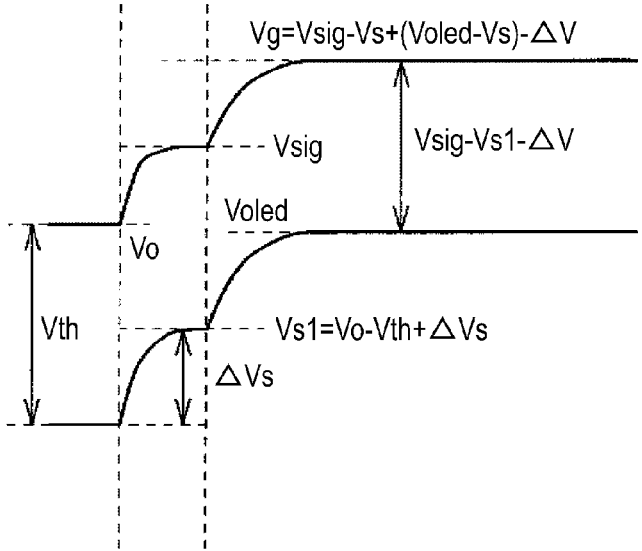

FIG.13
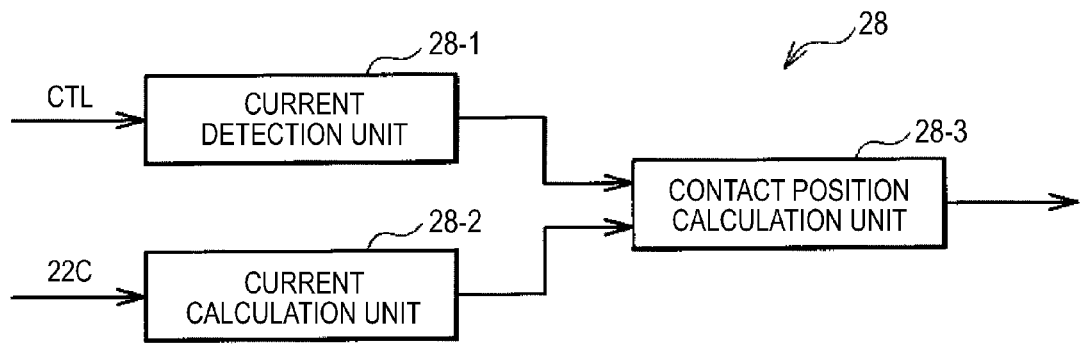
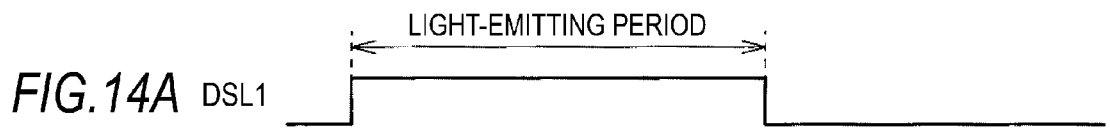
FIG.14A DSL1
FIG.14B DSL2
FIG.14C CTL1
FIG.14D CTL2
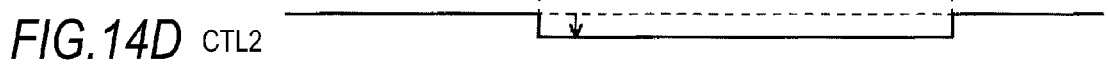
FIG.15A DSL1
FIG.15B DSL2
FIG.15C CTL1
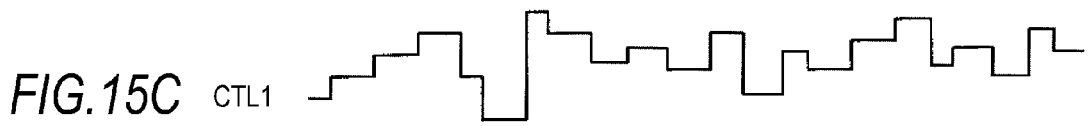
FIG.15D CTL2
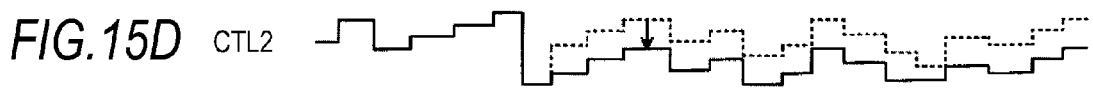

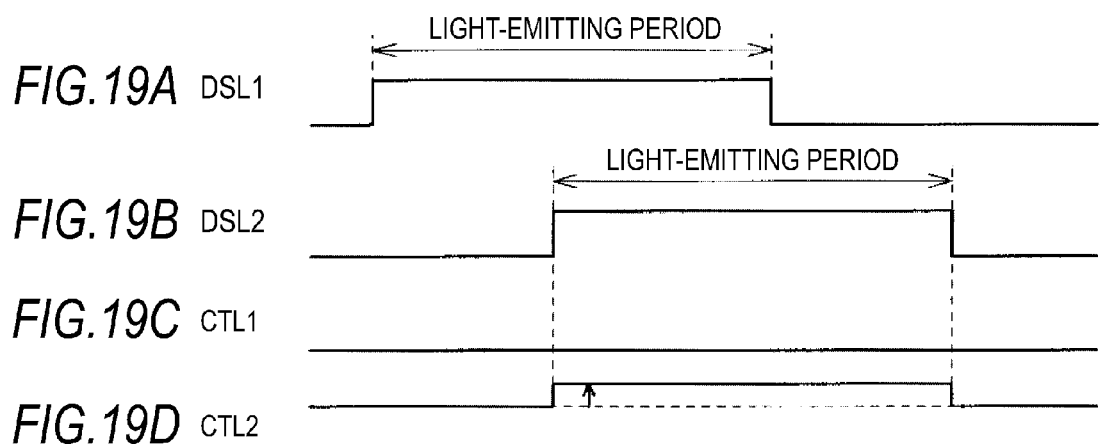
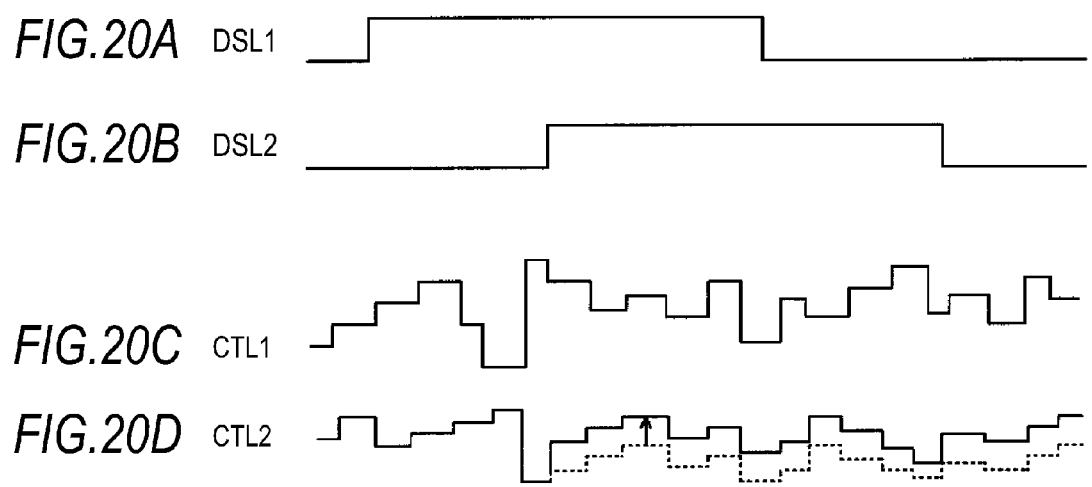

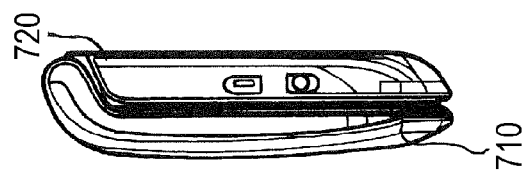
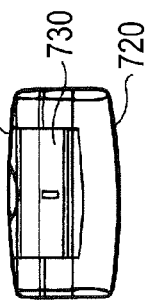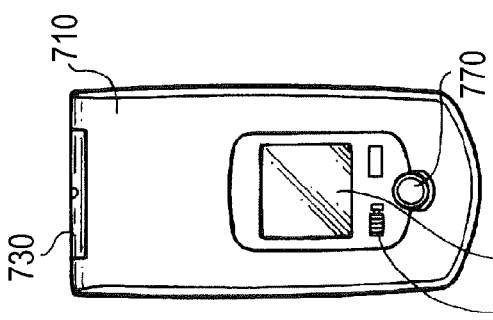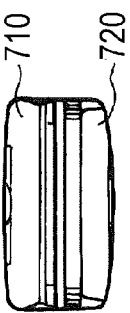
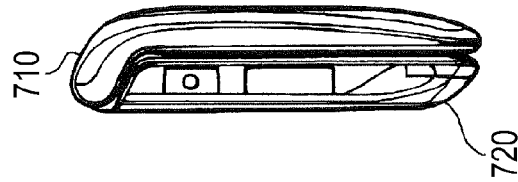
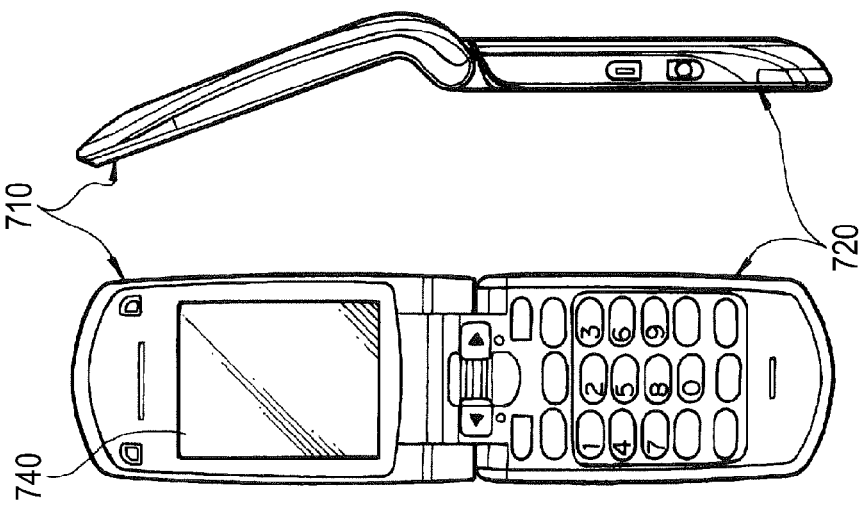

DISPLAY PANEL, DISPLAY DEVICE AND ELECTRONIC APPARATUS

CROSS REFERENCES TO RELATED APPLICATIONS

The present application claims priority to Japanese Priority Patent Application JP 2011-073076 filed in the Japan Patent Office on Mar. 29, 2011, the entire content of which is hereby incorporated by reference.

BACKGROUND

The present disclosure relates to a display panel including organic EL (electro luminescence) devices as well as a display device and an electronic apparatus including the display panel.

In recent years, a display device using a current-driven optical device whose light-emitting luminance varies in accordance with a value of flowing current such as the organic EL device as an light-emitting device of a pixel has been developed and commercialized in a field of display devices performing image display (for example, refer to JP-A-2008-083272 (Patent Document 1)). The organic EL device is a self-luminous device, which is different from a liquid crystal device and so on. As a light source (backlight) is not necessary in the display device using the organic EL devices (an organic EL display device), the display device can be made thinner than a liquid crystal display device in which the light source is necessary.

Incidentally, a display panel having organic EL devices in which a capacitance-type touch panel is provided on a display surface of the display panel is known (refer to JP-A-2008-216543 (Patent Document 2)). In the touch panel, detection electrodes are respectively provided on an inner surface and an outer surface of a substrate.

SUMMARY

As described above, when the touch panel formed as a different part from the display panel is provided on the display surface of the display panel, the thickness of the display device is increased by a thickness of the touch panel. Particularly, when the detection electrodes are provided on the inner surface and the outer surface of the substrate only for detecting a contact position of an object such as a finger, the thickness of the touch panel is further increased and it is difficult to reduce the thickness of the organic EL display device.

In view of the above, it is desirable to provide a thin display panel having a touch-panel function as well as a display device and an electronic apparatus including the display panel.

An embodiment of the present disclosure is directed to a display panel including plural display pixels arranged in a matrix state, in which each display pixel includes an organic EL device and a pixel circuit driving the organic EL device, the organic EL device is formed by stacking a first electrode connected to the pixel circuit, a light emitting layer and a second electrode, and the second electrode is a strip electrode shared by plural organic EL devices arranged in a row direction or a column direction.

Another embodiment of the present disclosure is directed to a display device including a display panel and a drive circuit driving the display panel. The display panel included in the display device has the same components as the above display panel. Still another embodiment of the present disclosure is directed to an electronic apparatus including the above display device.

In the display panel, the display device and the electronic apparatus according to the embodiments of the present disclosure, the second electrode included in each display pixel is the strip electrode shared by plural organic EL devices arranged in the row direction or in the column direction. Accordingly, the strip electrode can be used as the detection electrode detecting a contact position of an object such as a finger.

In the embodiment of the present disclosure, the drive circuit may include a contact position detection circuit detecting a contact position of an object based on variation of electric current flowing in the strip electrode. The contact position detection circuit may include, for example, a current detection unit detecting electric current flowing in the strip electrode and a current calculation unit deriving electric current at the time of a non-contact state based on a video signal. The contact position detection circuit may further includes, for example, a contact position calculation unit deriving contact position information based on a current value detected by the current detection unit and a current value derived by the current calculation unit.

In the embodiment of the present disclosure, the pixel circuit may include a storage capacitor, a first transistor writing a voltage corresponding to a video signal into the storage capacitor and a second transistor driving the organic EL device based on the voltage of the storage capacitor. In this case, the first transistor can be arranged at a position on which external light is incident or a light shielding layer for shielding external light incident on the pixel circuit can be provided on the display panel.

In the embodiment of the present disclosure, the display panel may include plural detection electrodes provided so as to extend in a direction intersecting with the strip electrode. In this case, the drive circuit may include a scanning unit sequentially scanning the plural strip electrodes during a non-light emitting period as well as driving respective detection electrodes in synchronized with the scanning of the strip electrodes.

In the display panel, the display device and the electronic apparatus according to the embodiments of the present disclosure, the strip electrode as an electrode of the organic EL device can be used as the detection electrode detecting a contact position of an object such as a finger, therefore, it is possible to give a touch panel function to the display panel while suppressing the increasing ratio in thickness to the minimum. Accordingly, a thin display panel having the touch panel function can be realized.

Additional features and advantages are described herein, and will be apparent from the following Detailed Description and the figures.

BRIEF DESCRIPTION OF THE FIGURES

FIG. 11 is a circuit diagram for explaining capacitances in a bottom emission structure;

FIGS. 12A to 12C are waveform diagrams for explaining bootstrap;

FIG. 13 is a view showing an example of an internal configuration of a contact position detection circuit of FIG. 8;

FIGS. 14A to 14D are waveform diagrams for explaining an example of electric current flowing in cathode lines obtained when external light is incident;

FIGS. 15A to 15D are waveform diagrams for explaining another example of electric current flowing in cathode lines obtained when external light is incident;

FIGS. 19A to 19D are waveform diagrams for explaining an example of electric current flowing in cathode lines obtained when external light is incident;

FIGS. 20A to 20D are waveform diagrams for explaining another example of electric current flowing in cathode lines obtained when external light is incident;

FIG. 26A is a front view of an application example 5 in an open state, FIG. 26B is a side view thereof, FIG. 26C is a front view thereof in a closed state, FIG. 26D is a left-side view thereof, FIG. 26E is a right-side view thereof, FIG. 26F is an upper surface view thereof and FIG. 26G is a lower surface view thereof.

DETAILED DESCRIPTION

Hereinafter, embodiments for carrying out the present disclosure will be explained in detail with reference to the drawings. The explanation will be made in the following order.

1. First Embodiment

Figure 1:
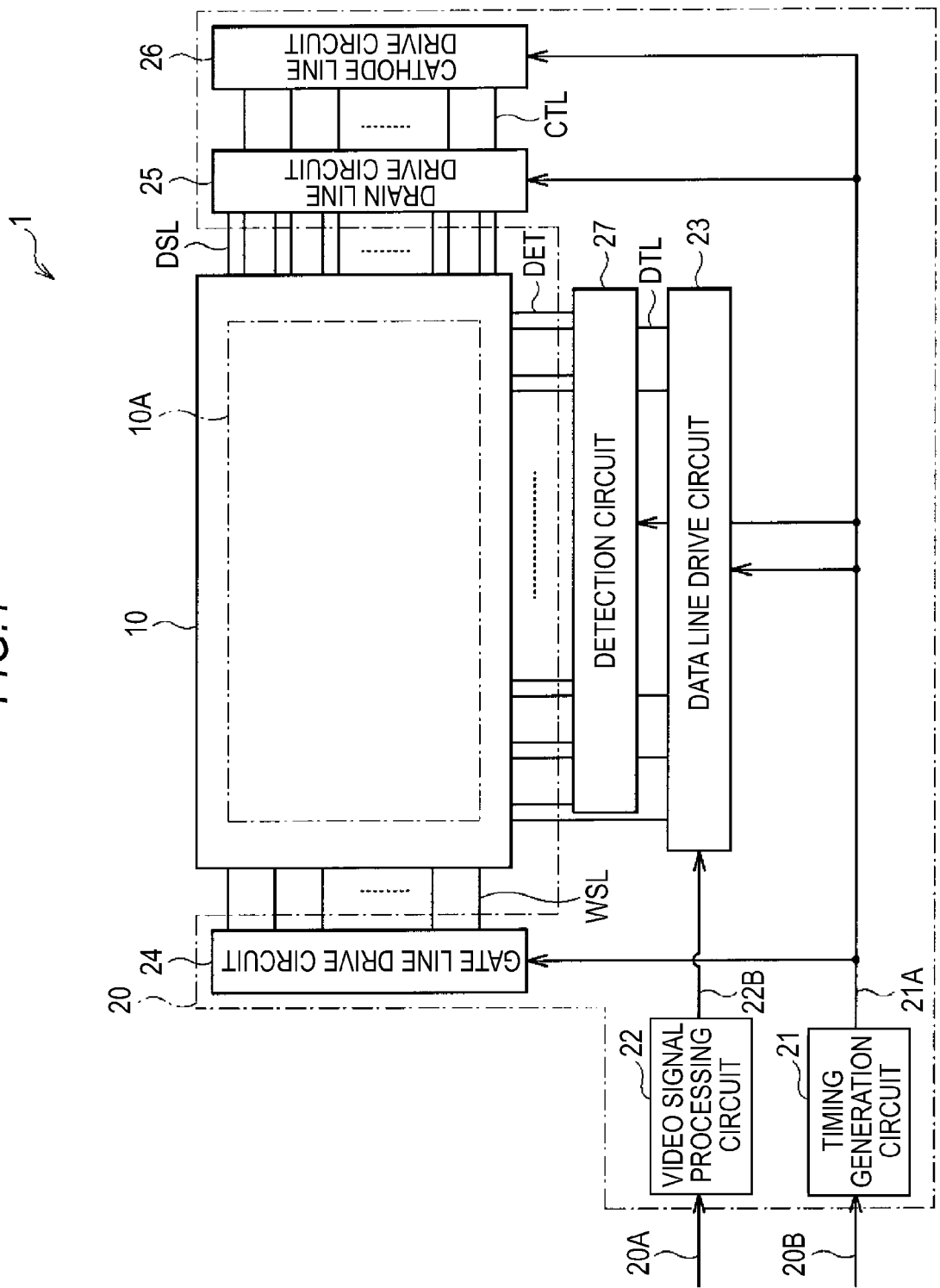
FIG. 1 is a schematic diagram of a display device according to a first embodiment.

Example in which a touch sensor is formed by cathode electrodes and detection electrodes 2. Second Embodiment Example in which a touch panel function is realized by monitoring electric current flowing in cathode electrodes 3. Module and Application Example 1. First Embodiment Configuration FIG. 1 shows an example of the entire configuration of a display device 1 according to a first embodiment. The display device 1 includes a display panel 10 and a drive circuit 20 driving the display panel 10.

Figure 2:
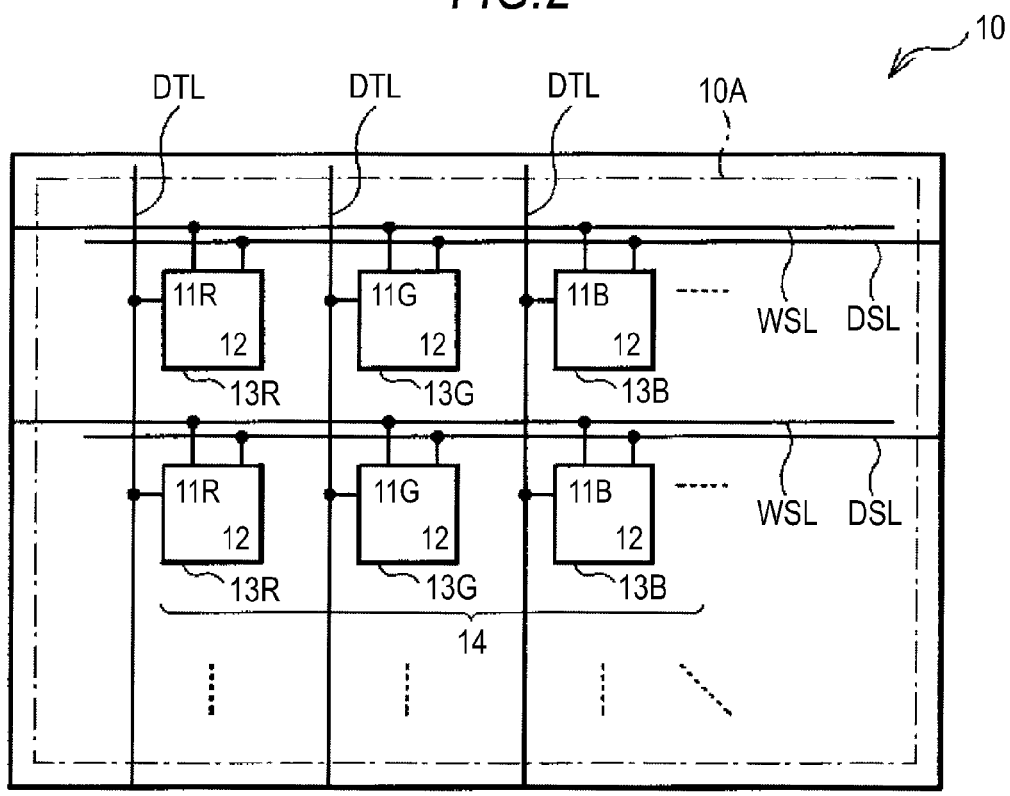
FIG. 2 is a diagram showing an internal configuration of a display panel of FIG. 1.

FIG. 2 shows an example of an internal configuration of the display panel 10. The display panel 10 includes a display area 10A in which plural display devices 14 are arranged two-dimensionally as shown in FIG. 2. The display panel 10 displays an image based on a video signal 20A inputted from the outside by performing active-matrix driving to respective display pixels 14. Each display pixel 14 includes a sub-pixel 13R for red, a sub-pixel 13G for green and a sub-pixel 13B for blue. In the following description, a sub-pixel 13 is used as a generic name for the sub-pixels 13R, 13G and 13B.

Figure 3:
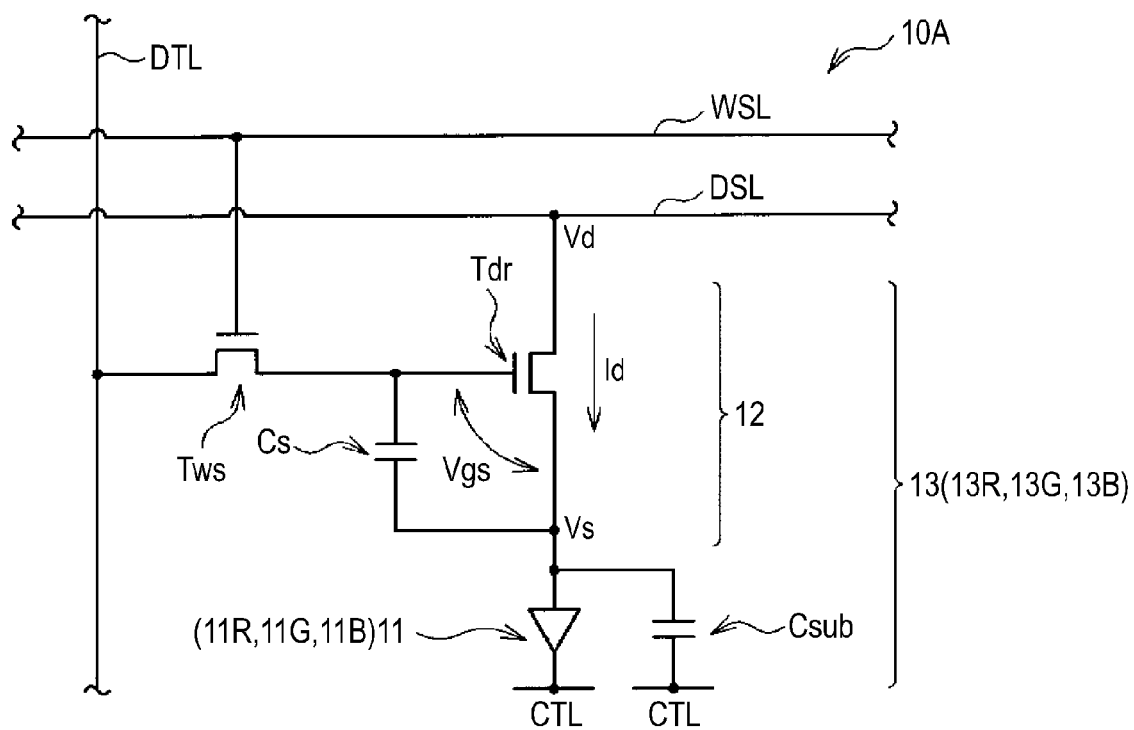
FIG. 3 is a circuit diagram showing a sub-pixel of FIG. 1.

FIG. 3 shows an example of a circuit configuration of the sub-pixel 13. The sub-pixel 13 includes an organic EL device 11, a capacitor Csub connected in parallel to the organic EL device 11 and a pixel circuit 12 driving the organic EL device 11. The capacitor Csub can be omitted or substituted by a parasitic capacitance if necessary. In the sub-pixel 13R, an organic EL device 11R emitting red light is provided as the organic EL device 11. Similarly, an organic EL device 11G emitting green light is provided as the organic EL device 11 in the sub-pixel 13G. An organic EL device 11B emitting blue light is provided as the organic EL device 11 in the sub-pixel 13B.

The pixel circuit 12 includes, for example, a write transistor Tws, a drive transistor Tdr and a storage capacitor Cs, which is a circuit configuration of 2Tr1C. The pixel circuit 12 is not limited to the circuit configuration of 2Tr1C, but can includes two write transistors Tws connected to each other in series or can include a transistor or a capacitor other than the above.

The write transistor Tws is a transistor writing a voltage corresponding to a video signal into the storage capacitor Cs. The drive transistor Tdr is a transistor driving the organic EL device 11 based on the voltage in the storage capacitor Cs written by the write transistor Tws. The transistors Tws and Tdr are formed by, for example, an n-channel MOS thin-film transistor (TFT). The transistors Tws and Tdr may be formed by a p-channel MOS TFT.

The write transistor Tws in the embodiment corresponds to a specific example of a "first transistor" in the appended claims and the drive transistor Tdr in the embodiment corresponds to a specific example of a "second transistor" in the appended claims. The storage capacitor Cs in the embodiment corresponds to a specific example of a "storage capacitor" in the appended claims.

The drive circuit 20 includes a timing generation circuit 21, a video signal processing circuit 22, a data line drive circuit 23, a gate line drive circuit 24, a drain line drive circuit 25, a cathode line drive circuit 26 and a detection circuit 27. The drive circuit 20 also includes data lines DTL connected to outputs of the data line drive circuit 23, gate lines WSL connected to outputs of the gate line drive circuit 24, drain lines DSL connected to outputs of the drain line drive circuit 25 and cathode lines CTL connected to outputs of the cathode electrode drive circuit 26. The cathode lines CTL are also cathode electrodes of the organic EL devices 11. The cathode electrodes of the organic EL device will be described later in detail.

The timing generation circuit 21 performs control so that, for example, the data line drive circuit 23, the gate line drive circuit 24, the drain line drive circuit 25 and the cathode line drive circuit 26 are driven in conjunction with one another. The timing generation circuit 21 outputs a control signal 21A to these circuits in accordance with (in synchronization with) a synchronization signal 20B inputted from the outside.

The video signal processing circuit 22 corrects the digital video signal 20A, for example, inputted from the outside as well as converts the corrected video signal into an analog signal to output a signal voltage 22B to the data line drive circuit 23.

The data line drive circuit 23 writes the analog signal voltage 22B inputted from the video signal processing circuit 22 into display pixels 14 (or sub-pixels 13) to be selected through respective data lines DTL in accordance with (in synchronization with) the input of the control signal 21A. The data line drive circuit 23 can output, for example, the signal voltage 22B and a fixed voltage unrelated to the video signal.

The gate line drive circuit 24 sequentially applies a selection pulse to plural gate lines WSL in accordance with (in synchronization with) the input of the control signal 21A to sequentially select plural display pixels 14 (or sub-pixels 13) on a gate line WSL basis. The gate line drive circuit 24 can output, for example, a voltage to be applied when turning on the write transistor Tws and a voltage to be applied when turning off the write transistor Tws.

The drain line drive circuit 25 sequentially applies a selection pulse to plural drain lines DSL in accordance with (in synchronization with) the input of the control signal 21A to supply power to plural pixel circuits 12 (specifically drains of the drive transistors Tdr). The drain line drive circuit 25 can output, for example, a voltage to be applied when allowing the organic EL devices 11 to emit light and a voltage to be applied when allowing the organic EL devices to turn off light.

The cathode line drive circuit 26 sequentially applies a selection pulse to plural cathode lines CTL in accordance with (in synchronization with) the input of the control signal 21A to sequentially turn on a touch sensor function on a cathode line CTL basis. The cathode line drive circuit 26 can output, for example, a voltage to be applied when turning on the touch sensor function and a voltage to be applied when turning off the touch function. The detection circuit 27 will be described later in detail.

Next, a connecting relation and arrangement of respective components will be explained with reference to FIG. 3.

Each gate line WSL is formed so as to extend in the row direction and is connected to a gate of the write transistor Tws. Each drain line DSL is also formed so as to extend in the row direction and is connected to a drain of the drive transistor Tdr. Each data line DTL is formed so as to extend in the column direction and is connected to a drain of the write transistor Tws. A source of the write transistor Tws is connected to a gate of the drive transistor Tdr and one terminal of the storage capacitor Cs. A source of the drive transistor Tdr and the other terminal of the storage capacitor Cs are connected to an anode of the organic EL device 11. A cathode of the organic EL device 11 is also used as the cathode line CTL. One terminal of the capacitor Csub is connected to one terminal (terminal close to the drive transistor Tdr) of the storage capacitor Cs, the source of the drive transistor Tdr and the anode of the organic EL device 11. The other terminal of the capacitor Csub is connected to the cathode line CTL.

Figure 4:
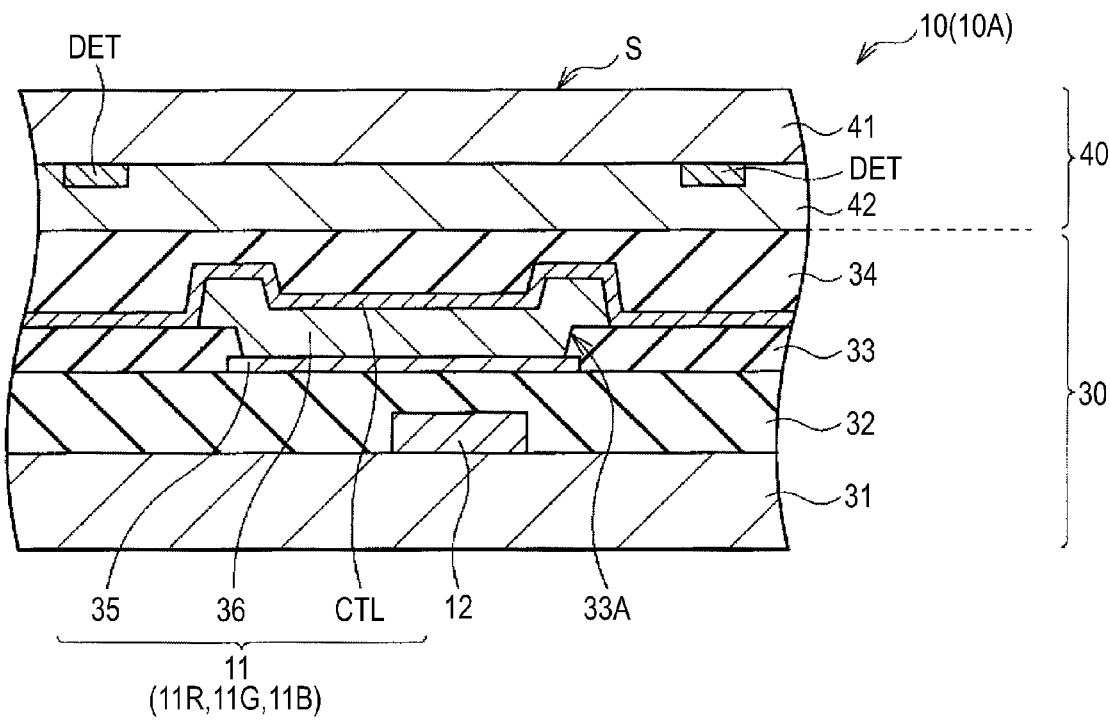
FIG. 4 is a cross-sectional view of the display panel of FIG. 1.

Next, a cross-sectional structure in the vicinity of the pixel circuit 12 in the display panel 10 will be explained. FIG. 4 shows an example of the cross-sectional structure in the vicinity of the pixel circuit 12 in the display panel 10. The display panel 10 has a structure in which a display unit 30 and a detection unit 40 are stacked each other, as shown, for example, in FIG. 4.

The display unit 30 has a structure in which the pixel circuit 12, an insulating layer 32, an insulating layer 33 and an insulating layer 34 are stacked in this order on a substrate 31 on and in the vicinity of the pixel circuit 12 as shown, for example, in FIG. 4. The insulating layer 33 has an opening 33A, and the organic EL device 11 is provided in the opening 33A. The organic EL device 11 has a structure in which an anode electrode 35, an organic layer 36 and the cathode line CTL are stacked in order from the bottom of the opening 33A, as shown, for example, in FIG. 4.

The anode electrode 35 is a flat film extending along a flat surface of the insulating layer 32. The anode electrode 35 is made of a metal material and functions as a reflection mirror. Therefore, the display panel 10 is a top-emission structure. The organic layer 36 includes, for example, a hole injection layer increasing hole injection efficiency, a hole transporting layer increasing hole transporting efficiency to a light emitting layer, the light emitting layer generating light emission by recombination of electrons and holes and an electron transporting layer increasing electron transporting efficiency to the light emitting layer in order from the side of the anode electrode 35. The cathode line CTL is formed so as to touch at least an upper surface of the organic layer 36. The cathode line CTL is a strip electrode which is formed so as to extend in the row direction (extending direction of the drain line DSL) and is shared by plural organic EL devices 11 arranged in the row direction. The plural cathode lines are arranged in parallel to one another. The cathode electrodes CTL are made of, a conductive material transparent to visible light, for example, ITO (Indium Tin Oxide).

Figure 5:
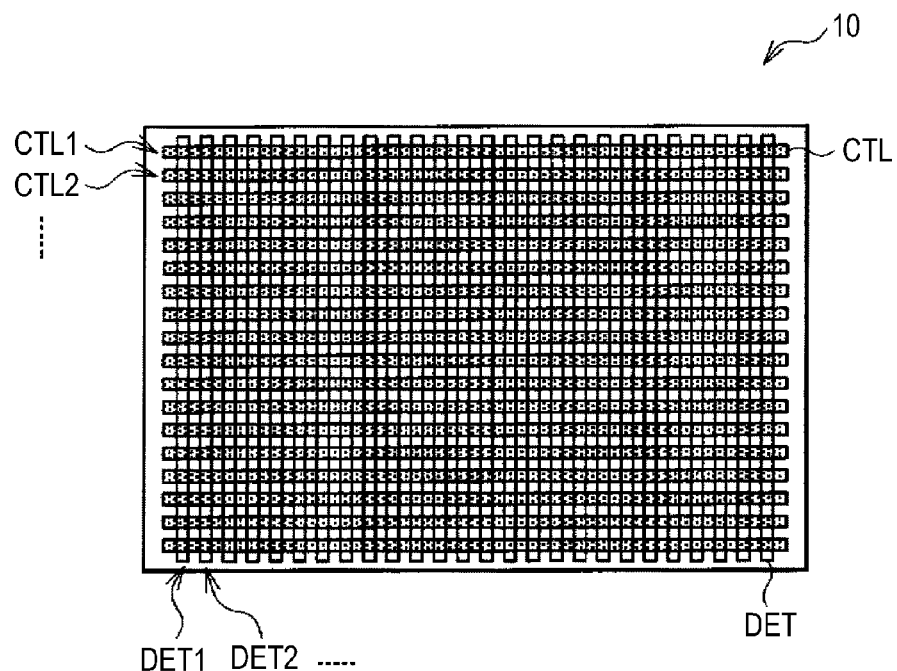
FIG. 5 is a layout diagram of cathode lines and detection electrodes of FIG. 1.

The detection unit 40 has a structure in which plural detection electrodes DET and an adhesive layer 42 are stacked on the substrate 41, and the detection electrodes DET are arranged toward the display unit 30 as shown, for example, in FIG. 4. The substrate 41 is made of a substrate transparent to visible light, for example, a light-transmissive resin film or a glass substrate. A rear face (surface on the opposite side of the detection electrodes DET) of the substrate 41 is a video display surface S of the display panel 10. It is possible to arrange some kind of optical function layer on the rear face of the substrate 41. The adhesive layer 42 is provided for bonding the display unit 30 to the detection unit 40 together. Each detection electrode DET is a strip electrode extending in a column direction (direction intersecting with the cathode line CTL) as shown in FIG. 5. The plural detection electrodes DET are arranged in parallel to one another. The plural detection electrodes DET are made of, for example, a metal material and arranged at positions other than positions right above the organic EL devices.

Here, a capacitor device is formed by, for example, the insulating layer 34 and the adhesive layer 42 as well as the cathode line CTL and the detection electrode DET arranged so as to face each other through these layers. Therefore, the capacitor device functions as a capacitance-type touch sensor in the display panel 10. The order of arranging the cathode line CTL, the insulating layer 34, the adhesive layer 42 and the detection electrode DET in the display panel 10 in the stacked direction is not limited to the above order of arrangement. Therefore, a dielectric sandwiched between the cathode line CTL and the detection electrode DET in the above capacitor device is not always the insulating layer 34 and the adhesive layer 42.

Next, the detection circuit 27 will be explained. The detection circuit 27 detects a contact position of an object such as a finger based on detection signals obtained by plural detection electrodes DET. Specifically, the detection circuit 27 is configured to detect contact/non-contact of the object such as the finger with respect to the video display surface S based on the detection signals obtained by the detection electrodes DET. The detection circuit 27 executes, for example, the following processes when detecting the contact of the object such as the finger with respect to the video display surface S. Specifically, the detection circuit 27 calculates a position where the object such as the finger has touched on the video display surface S based on application timing of the selection pulse outputted from the cathode line drive circuit 26 and detection timing of the detection signals having voltages equal to or lower than a threshold voltage.

[Operations]

Next, an example of operations of the display device 1 according to the embodiment will be explained.

In the display device 1, the signal voltage 22B corresponding to the video signal 20A is applied to respective data lines DTL by the data line drive circuit 23 as well as the selection pulse corresponding to the control signal 21A is sequentially applied to plural gate lines WSL and the drain lines DSL by the gate line drive circuit 24 and the drain line drive circuit 25. Actually, video is displayed through operations explained below.

Figure 6:
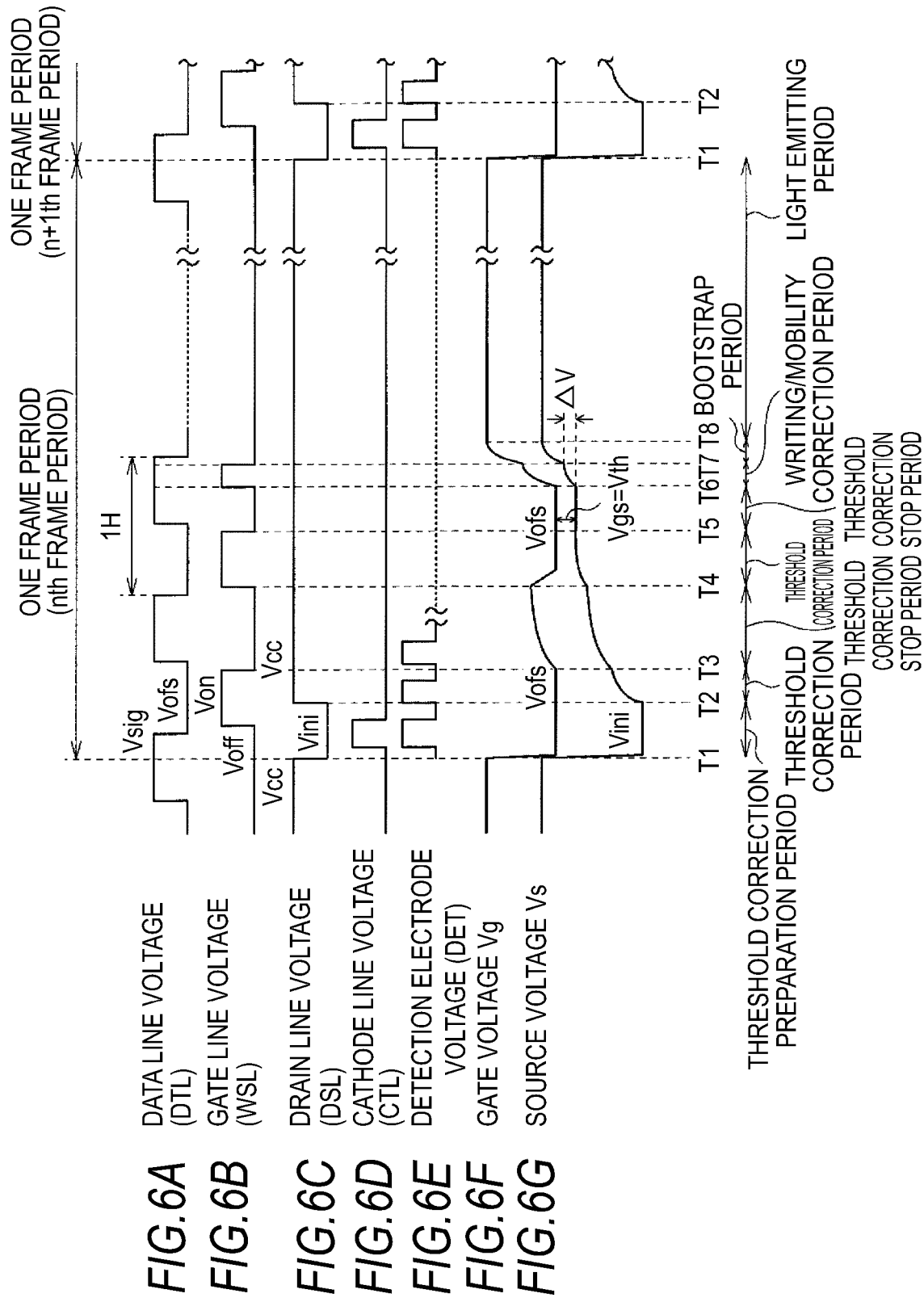
FIGS. 6A to 6G are waveform diagrams showing an example of operations of the display device of FIG. 1.
Figure 7:
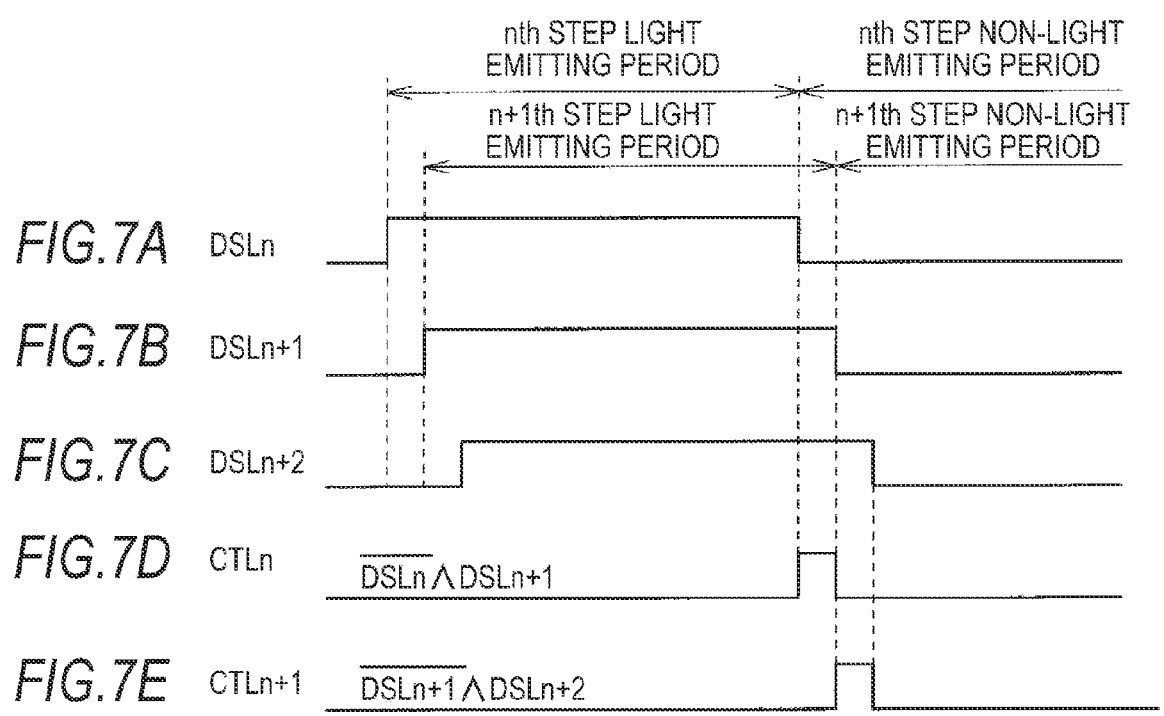
FIGS. 7A to 7E are waveform diagrams showing an example of a method of generating signal waveforms applied to the cathode lines.

FIGS. 6A to 6G show an example of voltage waveforms applied to a certain pixel circuit 12 and an example of variation of a gate voltage Vg and a source voltage Vs of the drive transistor Tdr. FIG. 6A shows a state in which a signal voltage Vsig and an offset voltage Vofs are applied to the data line DTL. FIG. 6B shows a state in which a voltage Von which turns on the write transistor Tws and a voltage Voff which turns off the write transistor Tws are applied to the gate line WSL. FIG. 6C shows a state in which a voltage Vcc and a voltage Vini are applied to the drain line DSL. Furthermore, FIGS. 6F and 6G show states in which the gate voltage Vg and the source voltage Vs of the drive transistor Tdr are changed from moment to moment in accordance with voltage application to the drain line DSL, the gate line DTL and the gate line WSL. In FIGS. 6D and 6E, a voltage waveform applied to the cathode line CTL and a voltage waveform detected by the detection electrode DET are shown, which will be explained later in detail after explanation of a series of operations.

(Threshold Correction Preparation Period)

First, preparation for threshold correction is made. Specifically, when the voltage of the gate line WSL is Voff and the voltage of the drain line DSL is Vcc (namely, when the organic EL device 11 emits light), the drain line drive circuit 25 reduces the voltage of the drain line DSL from Vcc to Vini (T1). Then, the source voltage Vs becomes Vini and the organic EL device 11 is turned off. After that, the gate line drive circuit 24 increases the voltage of the gate line WSL from Voff to Von when the voltage of the data line DTL is Vofs to allow the gate of the drive transistor Tdr to be Vofs.

(First Threshold Correction Period)

Next, the threshold correction is performed. Specifically, the drain line drive circuit 25 increases the voltage of the drain line DSL from Vini to Vcc while the write transistor Tws is in an on state and the voltage of the data line DTL is Vofs (T2). Then, an electric current Ids flows between the drain and the source of the drive transistor Tdr and the source voltage Vs is increased. After that, the gate line drive circuit 24 reduces the voltage of the gate line WSL from Von to Voff before the data line drive circuit 23 switches the voltage of the data line DTL from Vofs to Vsig (T3). Then, the gate of the drive transistor Tdr is in a floating state and the threshold correction is stopped.

(First Threshold Correction Stop Period)

During a period in which the threshold correction is stopped, for example, sampling of the voltage of the data line DTL is performed in another row (pixels) different from the row (pixels) to which the previous threshold correction has been performed. At this time, the source voltage Vs is lower than Vofs−Vth (Vth is a threshold voltage of the drive transistor Tdr) in the row (pixels) to which the previous threshold correction has been performed, therefore, the electric current Ids flows between the drain and the source of the drive transistor Tdr, the source voltage Vs is increased and the gate voltage Vg is also increased due to coupling through the storage capacitor Cs in the row (pixels) to which the previous threshold correction has been performed also during the threshold correction stop period.

(Second Threshold Correction Period)

Next, the threshold correction is performed again. Specifically, the gate line drive circuit 24 increases the voltage of the gate line WSL from Voff to Von and allows the gate voltage of the drive transistor Tdr to be Vofs during a period when the voltage of the data line DTL is Vofs and the threshold correction can be performed (T4). At this time, when the source voltage Vs is lower than Vofs−Vth (when the threshold correction has not been completed), the electric current Ids flows between the drain and the source of the drive transistor Tdr until the drive transistor Tdr is cut off. After that, the gate line drive circuit 24 reduces the voltage of the gate line WSL from Von to Voff before the data line drive circuit 23 switches the voltage of the data line DTL from Vofs to Vsig (T5). As a result, the gate of the drive transistor is in the floating state, therefore, a gate-source voltage Vgs can be maintained to be constant regardless of the magnitude of the voltage of the data line DTL.

When the storage capacitor Cs is charged to be Vth and the gate-source voltage Vgs is Vth in the threshold correction period, the drive circuit 20 completes the threshold correction. However, when the gate-source voltage Vgs does not reach the Vth, the drive circuit 20 repeatedly executes the threshold correction and the stop of the threshold correction until the gate-source voltage Vgs reaches Vth.

(Writing/Mobility Correction Period)

After the threshold correction stop period is completed, writing and mobility correction are performed. Specifically, the gate line drive circuit 24 increases the voltage of the gate line WSL from Voff to Von during when the voltage of the data line DTL is Vsig (T6), and connects the gate of the drive transistor Tdr to the data line DTL. Then, the gate voltage Vg of the drive transistor Tdr will be the voltage Vsig of the data line DTL. At this time, an anode voltage of the organic EL device 11 is lower than a threshold voltage Vel of the organic EL device 11 and the organic EL device 11 is cut off in this stage. Accordingly, the electric current Ids flows in the device capacitor (not shown) of the organic EL device 11 and the device capacitor is charged, therefore, the source voltage Vs is increased by ΔV, then, the gate-source voltage Vgs will be Vsig+Vth−ΔV. In this manner, the mobility correction is performed at the same time as writing. Here, the larger the mobility of the drive transistor Tdr is, the higher ΔV becomes, therefore, variation of mobility in respective pixels 13 can be eliminated by reducing the gate-source voltage Vgs by ΔV before light emission.

(Bootstrap Period)

Lastly, the gate line drive circuit 24 reduces the voltage of the gate line WSL from Von to Voff (T7). Then, the gate of the drive transistor Tdr is in the floating state and the electric current Ids flows between the drain and the source of the drive transistor Tdr as well as the source voltage Vs is increased. As a result, the voltage equal to or higher than the threshold voltage Vel is applied to the organic EL device 11 and the organic EL device 11 starts emitting light at desired luminance.

As described above, in the display device 1 according to the embodiment, when the pixel circuit 12 is on/off controlled in each sub-pixel 13 and drive current is injected to the organic EL device 11 of each sub-pixel 13, holes are recombined with electrons and light is emitted, then, the light is taken to the outside. As a result, an image is displayed in the display area 10A of the display panel 10.

Incidentally, the drive circuit 20 performs a touch detection operation during a period when there is no adverse affect for image display, specifically during non-light emitting period. Specifically, the cathode line drive circuit 26 applies the selection pulse to the cathode lines CTL during a period when the organic EL device 11 is in an off state in the threshold correction preparation period as shown in FIG. 6D. The selection pulse can be obtained by performing logical sum between an inverse pulse of the selection pulse to be applied to the drain line DSLn corresponding to the cathode line CTL to which the selection pulse is applied and the selection pulse applied to a drain line DSLn+1 corresponding to the cathode line CTL to which the selection pulses is applied next as shown in, for example, FIG. 7A to 7E.

When the selection pulse is applied to the cathode lines CTL as described above, signals corresponding to the selection pulse applied to the cathode lines CTL are outputted from respective detection electrodes DET. In the case where an object touches on the video display surface S in the vicinity of the cathode lines CTL to which the selection pulse is applied, signals affected by the object are outputted from the detection electrodes DET positioned close to the object. These signals are inputted to the detection circuit 27 and a position where the object touches is calculated in the detection circuit 27.

[Advantages]

Next, advantages obtained by the display device 1 according to the embodiment will be explained. In the embodiment, the cathode electrode of the organic EL device of each sub-pixel 13 is the cathode line CTL in a strip shape extending in a row direction, which is used as a detection electrode detecting a contact position of the object such as the finger. Accordingly, it is possible to give the touch panel function to the display panel 10 while suppressing the increasing rate in thickness of the display panel 10 to the minimum. Therefore, the thin-type display panel 10 having the touch panel function can be realized in the embodiment.

2. Second Embodiment

Next, a display device 2 according to a second embodiment will be explained. The display device 2 according to the embodiment differs from the display device 1 according to the above embodiment in a point that a display panel 50 having a bottom-emission structure is included. Accordingly, the point different from the above embodiment will be chiefly explained and points common to the above embodiment will be appropriately omitted.

Figure 8:
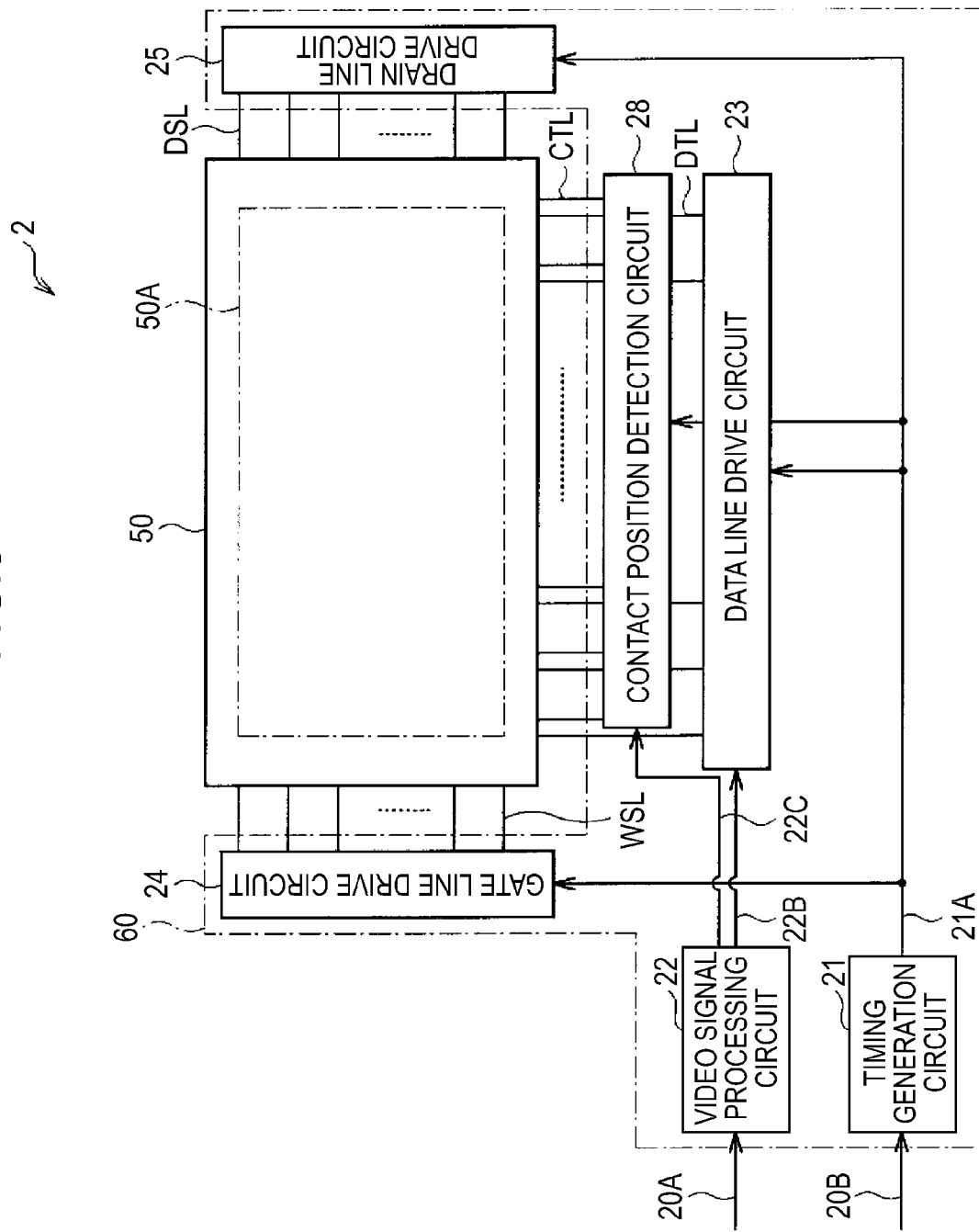
FIG. 8 is a schematic diagram of a display device according to a second embodiment.

FIG. 8 shows an example of the entire configuration of the display device 2. The display device 2 includes the display panel 50 and a drive circuit 60 driving the display panel 50.

Figure 9:
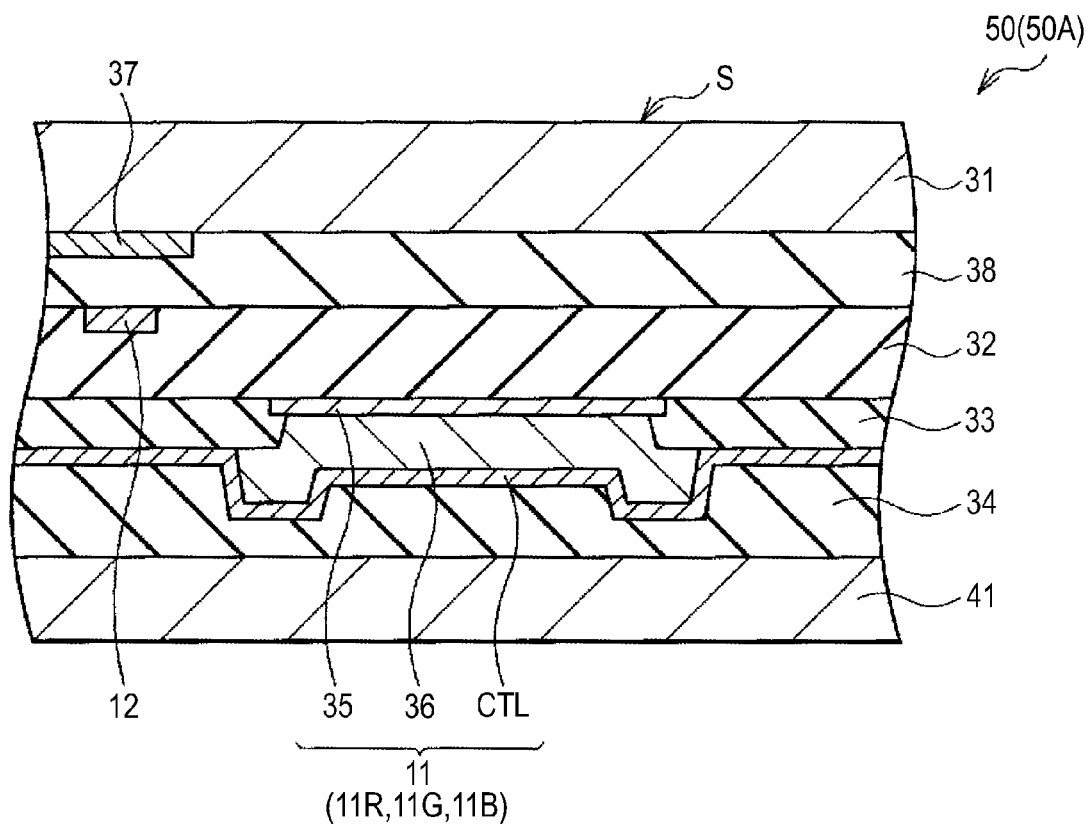
FIG. 9 is a cross-sectional view of the display panel of FIG. 8.

FIG. 9 shows an example of a cross-sectional structure of the display panel 50. The display panel 50 has a structure in which the display unit 30 in the above embodiment is arranged upside down as shown, for example, FIG. 9. Therefore, a surface of the substrate 31 is the video display surface S in the embodiment. Also in the display panel 50, the detection unit 40 according to the above embodiment is omitted.

Figure 10:
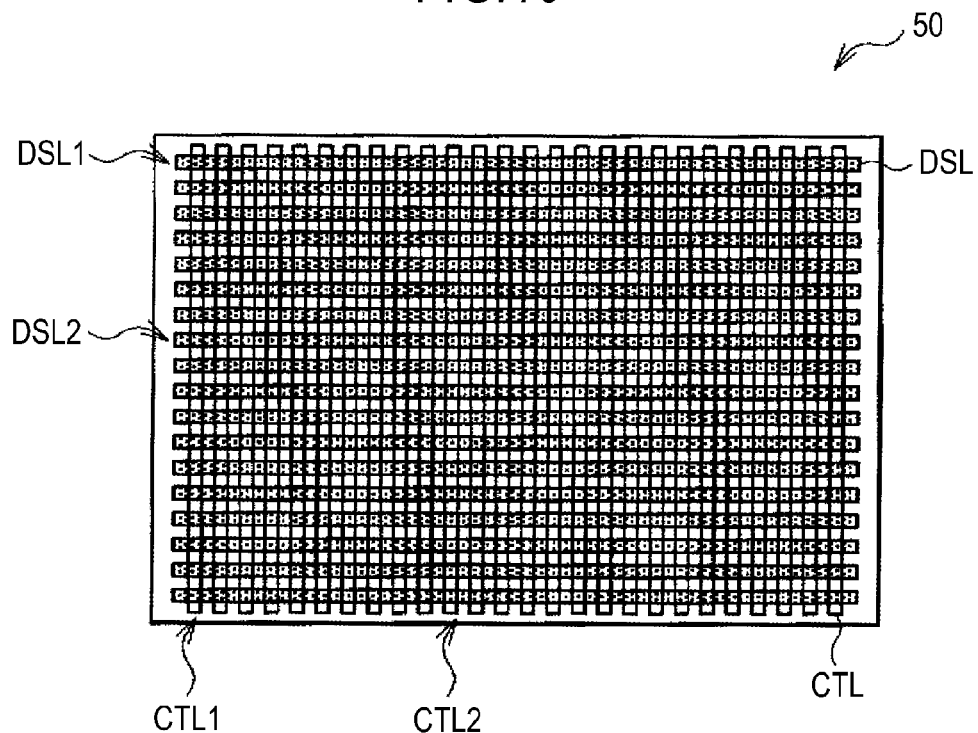
FIG. 10 is a layout diagram of drain lines and detection electrodes of FIG. 8.

In the embodiment, the anode electrode 35 is made of a transparent conductive material such as ITO. On the other hand, the cathode line CTL is made of a metal material, functioning as the reflection mirror. Therefore, the display panel 50 has the bottom-emission structure. In the embodiment, the cathode line CTL is a strip electrode which is formed so as to extend in the column direction (direction intersecting with the drain line DSL) and is shared by plural organic EL devices 11 arranged in the column direction as shown in, for example, FIG. 10.

The display panel 50 includes a light shielding layer 37 and an insulating layer 38 between the substrate 31 and the insulating layer 32 as shown, for example, in FIG. 9. The light shielding layer 37 shields external light incident on the pixel circuit 12, which is arranged between the substrate 31 and the pixel circuit 12 as shown, for example, in FIG. 9. The insulating layer 38 is formed for planarizing a surface including the light shielding layer 37.

Next, the touch sensor function in the embodiment will be explained.

First, a bootstrap operation in related art will be explained with reference to FIG. 11 and FIGS. 12A to 12C. When the writing period is completed and the write transistor Tws is turned off, the gate-source voltage Vgs of the drive transistor Tdr is maintained by the storage capacitor Cs, therefore, the gate voltage Vg and the source voltage Vs are increased while maintaining the gate-source voltage Vgs, and the source voltage Vs is increased to a voltage Voled corresponding to the current of the drive transistor Tdr. The operation in which the gate voltage Vg and the source voltage Vs are increased while maintaining the gate-source voltage Vgs is called the bootstrap operation.

At the moment when the mobility correction/writing period is completed, the signal voltage Vsig is written in the gate voltage Vg, and the source voltage Vs will be a voltage Vs1=V0−Vth+ΔVs, which has been increased from the voltage at the time of completing the threshold correction by the voltage increased amount ΔVs corresponding to each mobility. Here, when the write transistor Tws is turned off, the gate-source voltage Vgs of the drive transistor Tdr is maintained by the storage capacitor Cs, therefore, the source voltage Vs is increased to the voltage Voled corresponding to the electric current Ids flowing in the drive transistor Tdr. As the source voltage is increased, the gate voltage Vg is also increased through the storage capacitor Cs. An increased amount at this time is ideally the same as an increased amount Voled−Vs1 of the source voltage Vs. However, when there is a parasitic capacitance in the transistor, the increased amount will be smaller than the increased amount of the source voltage Vs.

As shown in FIG. 11, there are parasitic capacitances Cgs, Cgd and Cws in the drive transistor Tdr and the write transistor Tws. Accordingly, in the case where the source voltage Vs is increased from Vs1 to Vs22, the gate voltage Vg is increased only by (Cs+Cgs)/(Cs+Cgs+Cgd+Cws)× (Vs2−Vs1).

The coefficients (Cs+Cgs)/(Cs+Cgs+Cgd+Cws) will be definitely 1 or less, therefore, the increased amount of the gate voltage Vg is smaller than the increased amount of the source voltage Vs. The coefficient is referred to as a bootstrap gain Gb. In this case, a gate-source voltage Vgs2 obtained after the bootstrap will be lower than a gate-source voltage Vgs21 obtained before the bootstrap by (1−Gb)× ΔVs.

As described above, when there is the parasitic capacitance in the transistor, the increased amount of the gate voltage Vg is smaller than the increased amount of the source voltage Vs due to the bootstrap operation, therefore, the gate-source voltage Vgs of the drive transistor Tdr is lower than the gate-source voltage Vgs obtained when the mobility correction is completed due to the bootstrap operation.

As the display panel 50 has the bottom emission structure in the embodiment, the pixel circuit 12 is positioned close to the video display surface S. Accordingly, when an object comes close to the video display surface S, a capacitor Ct is formed between the gate of the drive transistor Tdr close to the object and the object. Accordingly, the bootstrap gain of the sub-pixel 13 in the vicinity of the object is lower than the bootstrap gain of the sub-pixel 13 which is apart from the object. As a result, the gate-source voltage Vgs is lower and electric current is reduced in the sub-pixel 13 close to the object. In the embodiment, the position of the object is detected by detecting the reduction of electric current.

In the drive circuit 60 according to the embodiment, a contact position detection circuit 28 is provided instead of the cathode line drive circuit 26 in the drive circuit 20, and the detection circuit 27 is omitted. The contact position detection circuit 28 detects the position of the object by detecting the reduction of the electric current, including, for example, a current detection unit 28-1, a current calculation unit 28-2 and a contact position calculation unit 28-3.

The current detection unit 28-1 detects electric current flowing in the cathode line CTL, outputting, for example, a voltage of a resistor connected in series to the cathode line CTL or a signal corresponding to the voltage. The current calculation unit 28-2 derives electric current at the time of a non-contact state based on a video signal, outputting, for example, a voltage of the resistor obtained when the electric current at the time of the non-contact state derived based on the video signal is allowed to flow in the resistor of the current detection unit 28-1 or a signal corresponding to the voltage. The contact position calculation unit 28-3 derives contact position information based on a value of electric current detected by the current detection unit 28-1 and a value of electric current derived by the current calculation unit 28-2. The contact position calculation unit 28-3 derives contact position information based on the voltage or the signal outputted from the current detection unit 28-1 and the voltage or the signal outputted from the current calculation unit 28-2. The contact position calculation unit 28-3 derives the contact position information based on a result of comparison of difference between voltages or signals outputted from both units and a given threshold.

FIGS. 14A to 14D show an example of the relation between current waveforms flowing in the cathode lines CTL and selection pulses (namely, light-emitting periods) inputted to the drain lines DSL appearing when a monochromatic image is outputted. The reason why phases are different in FIGS. 14A and 14B is that the drain lines DSL are sequentially selected on a line basis.

For example, in the case where the object touches the video display surface S in the vicinity of a position where a cathode line CTL 2 intersects with a drain line DSL 2 and the objects is apart from the position where a cathode line CTL 1 intersects with a drain line DSL 1, electric current is reduced only in a period when the drain line DSL 2 is selected as shown in FIG. 14D. Accordingly, it is possible to detect the line and timing where the current is reduced as well as detect the position of the object by calculating the current flowing in each cathode line CTL from the video signal and comparing the current value with an actual measurement value.

FIGS. 15A to 15D show an example of the relation between current waveforms flowing in the cathode lines CTL and selection pulses (namely, light-emitting periods) inputted to the drain lines DSL appearing when a color image is outputted. Also in this case, electric current is reduced only in the period when the drain line DSL 2 is selected in the same manner as described above. Accordingly, it is possible to detect the line and timing where the current is reduced as well as detect the position of the object by calculating the current flowing in each cathode line CTL from the video signal and comparing the current value with an actual measurement value.

[Modification Example]

Figure 16:
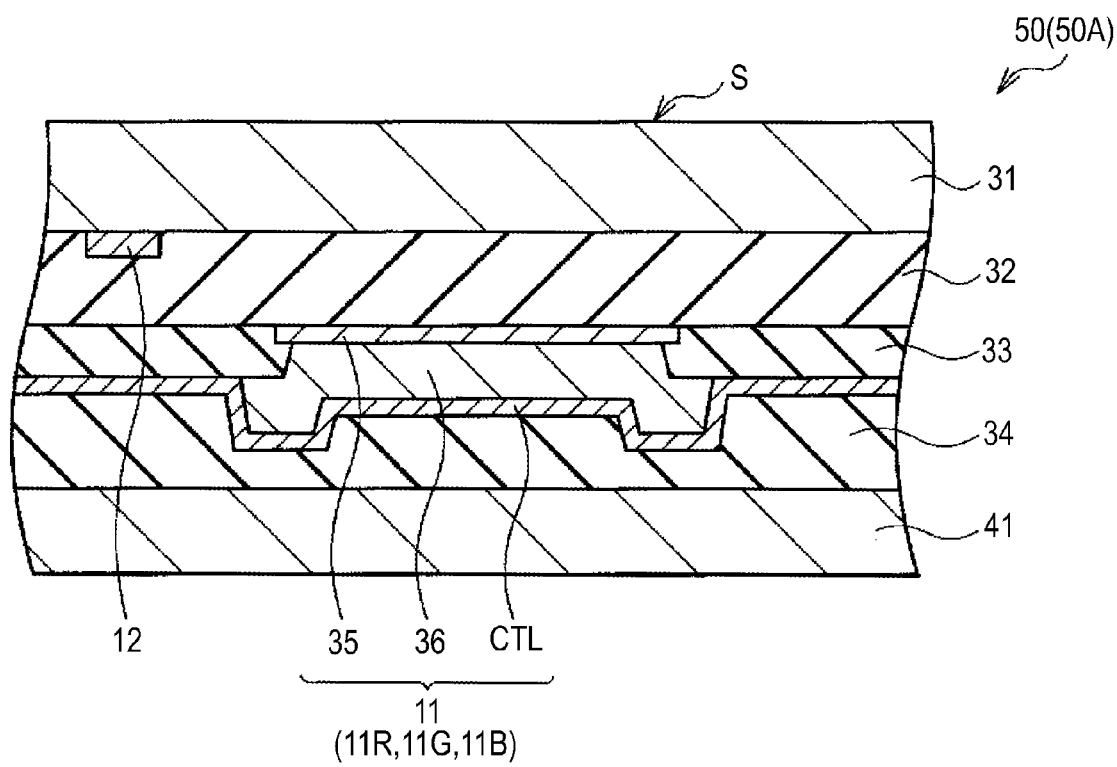
FIG. 16 is a cross-sectional view showing a modification example of the display panel of FIG. 9.

The shielding layer 37 is provided in the second embodiment, however, the shielding layer 37 may be omitted as shown, for example, in FIG. 16. In this case, the pixel circuit 12 including the write transistor Tws and so on is arranged at a position where external light is incident.

Figure 17:
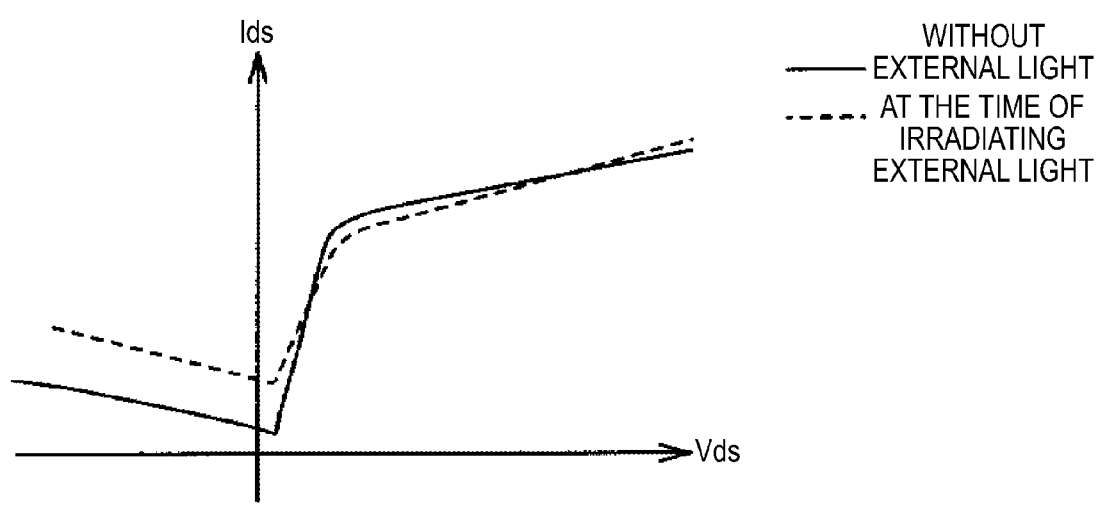
FIG. 17 is I-V characteristic view for explaining leak current occurring when external light is incident.
Figure 18:
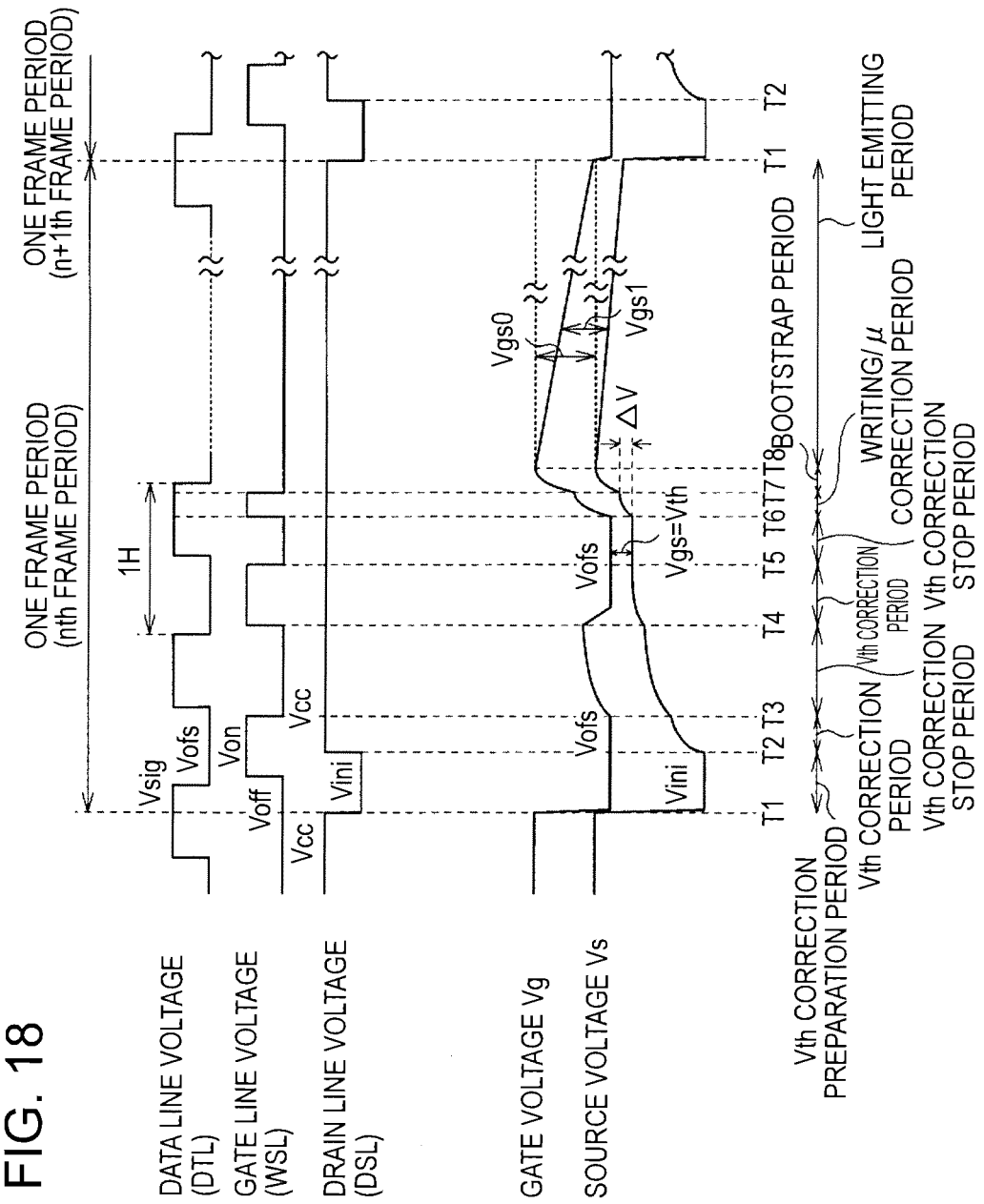
FIG. 18 is a waveform diagram for explaining a gate-source voltage obtained when external light is incident.

Generally, when light is incident on the transistor, transistor characteristics vary and leak current in off-areas is increased as shown in FIG. 17. Assume that characteristic variation occurs in the pixel circuit 12, the leak current of the write transistor Tws is increased when light is incident on the write transistor Tws connected to the storage capacitor Cs. Accordingly, electric charges are leaked from the storage capacitor Cs as well as the gate-source voltage Vgs of the drive transistor Tdr is reduced, as a result, luminance is also reduced (refer to FIG. 18). Therefore, when the object touches the video display surface S, external light is shielded by the object in the sub-pixel 13 in the vicinity of the object, as a result, the current amount flowing in the cathode line CTL is increased. On the other hand, external light is not shielded by the object in the sub-pixel 13 which is apart from the object, therefore, light is incident on the write transistor Tws and the current amount flowing in the cathode line CTL is reduced.

Accordingly, it is possible to detect the line and timing where the current is reduced as well as detect the position of the object by calculating the current flowing in each cathode line CTL from the video signal and comparing the current value with an actual measurement value.

FIGS. 19A to 19D show an example of the relation between current waveforms flowing in the cathode lines CTL and selection pulses (namely, light-emitting periods) inputted to the drain lines DSL appearing when a monochromatic image is outputted.

For example, in the case where the object touches the video display surface S in the vicinity of the position where the cathode line CTL 2 intersects with the drain line DSL 2 and the objects is apart from the position where the cathode line CTL 1 intersects with the drain line DSL 1, electric current is increased only in a period when the drain line DSL 2 is selected as shown in FIG. 19D. Accordingly, it is possible to detect the line and timing where the current is increased as well as detect the position of the object by calculating the current flowing in each cathode line CTL from the video signal and comparing the current value with an actual measurement value.

FIGS. 20A to 20D show an example of the relation between current waveforms flowing in the cathode lines CTL and selection pulses (namely, light-emitting periods) inputted to the drain lines DSL appearing when a color image is outputted. Also in this case, electric current is increased only in the period when the drain line DSL 2 is selected in the same manner as described above. Accordingly, it is possible to detect the line and timing where the current is increased as well as detect the position of the object by calculating the current flowing in each cathode line CTL from the video signal and comparing the current value with an actual measurement value.

3. Module and Application Example

Hereinafter, application examples of display devices 1 and 2 explained in the above embodiments will be explained. The display devices 1 and 2 can be applied to display devices of electronic apparatuses in various fields displaying a video signal inputted from the outside or a video signal generated inside as images or video, which are, for example, a television device, a digital camera, a notebook personal computer, portable terminal devices such as a cellular phone device, a video camera.

[Module]

Figure 21:
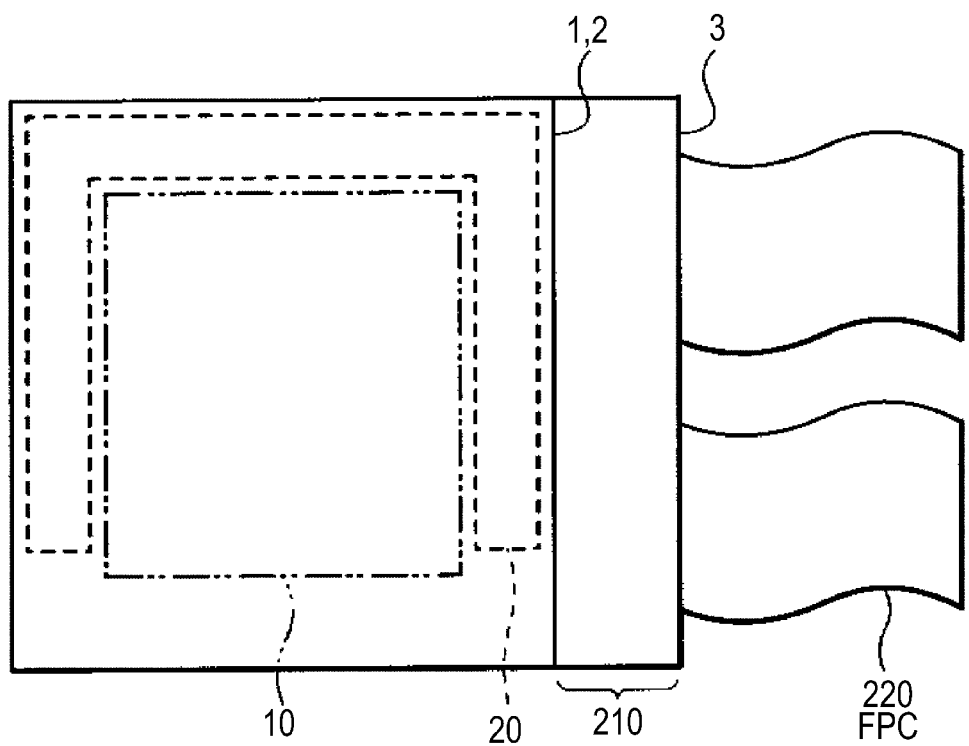
FIG. 21 is a plan view showing a schematic structure of a module including the display device according to the above respective embodiments.

The display devices 1 and 2 are, for example, incorporated into various electronic apparatuses such as later-described application examples 1 to 5 in a form of a module shown in FIG. 21. The module is provided with an area 210 exposed from a member (not shown) sealing the display panel 10 or 50 in one edge of a substrate 3, and external connection terminals (not shown) are formed in the exposed area 210 by extending wiring of the timing generation circuit 21, the video signal processing circuit 22, the data line drive circuit 23, the gate line drive circuit 24, the drain line drive circuit 25, the cathode line drive circuit 26, the detection circuit 27 and the contact position detection circuit 28. A flexible printed circuit (FPC) 220 for input/output of signals may be provided in the external connection terminal.

[Application Example 1]

Figure 22:
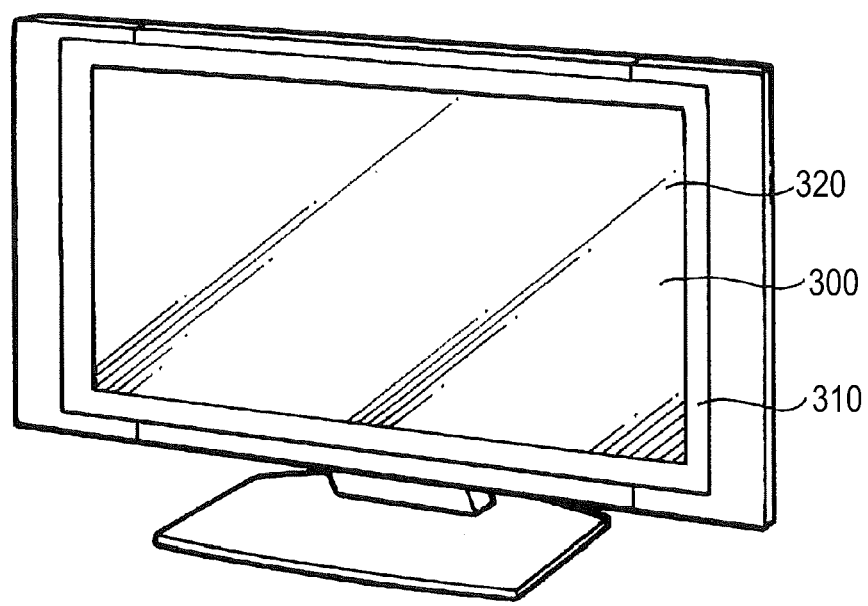
FIG. 22 is a perspective view showing an appearance of an application example 1 of the display device according to embodiments.

FIG. 22 shows an appearance of a television device to which the display devices 1 and 2 are applied. The television device includes, for example, a video display screen unit 300 having a front panel 310 and a filter glass 320, in which the video display screen unit 300 is configured by the display device 1 or 2.

[Application Example 2]

Figure 23A:
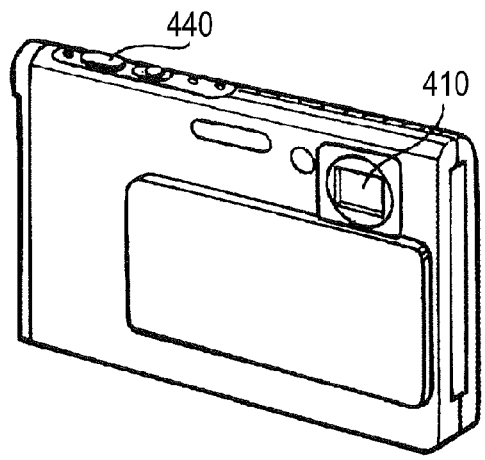
FIG. 23A is a perspective view showing an appearance of an application example 2 seen from the front and FIG. 23B is a perspective view showing the appearance thereof seen from the back.
Figure 23B:
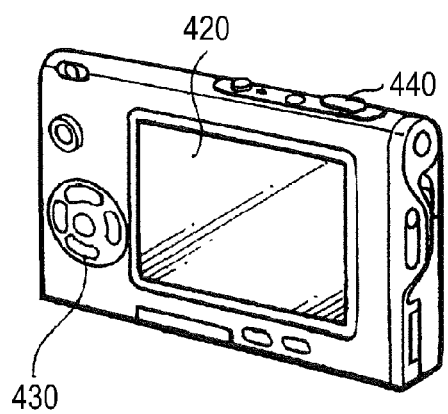

FIGS. 23A and 23B show an appearance of a digital camera to which the display devices 1 and 2 are applied. The digital camera includes, for example, a light emitting unit 410 for flash, a display unit 420, a menu switch 430, a shutter button 440, in which the display unit 420 is configured by the display device 1 or 2.

[Application Example 3]

Figure 24:
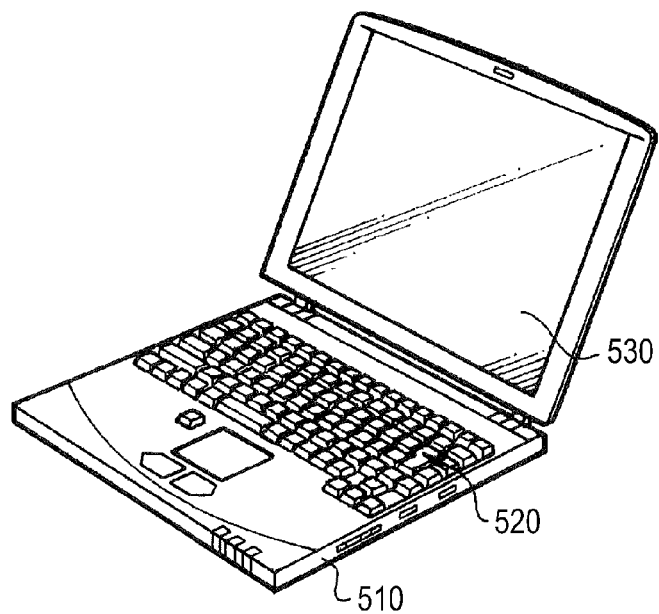
FIG. 24 is a perspective view showing an appearance of an application example 3.

FIG. 24 shows an appearance of a notebook personal computer to which the display devices 1 and 2 are applied. The notebook personal computer includes, for example, a main body 510, a keyboard 520 for input operation of characters and so on and a display unit 530 displaying images, in which the display unit 530 is configured by the display device 1 or 2.

[Application Example 4]

Figure 25:
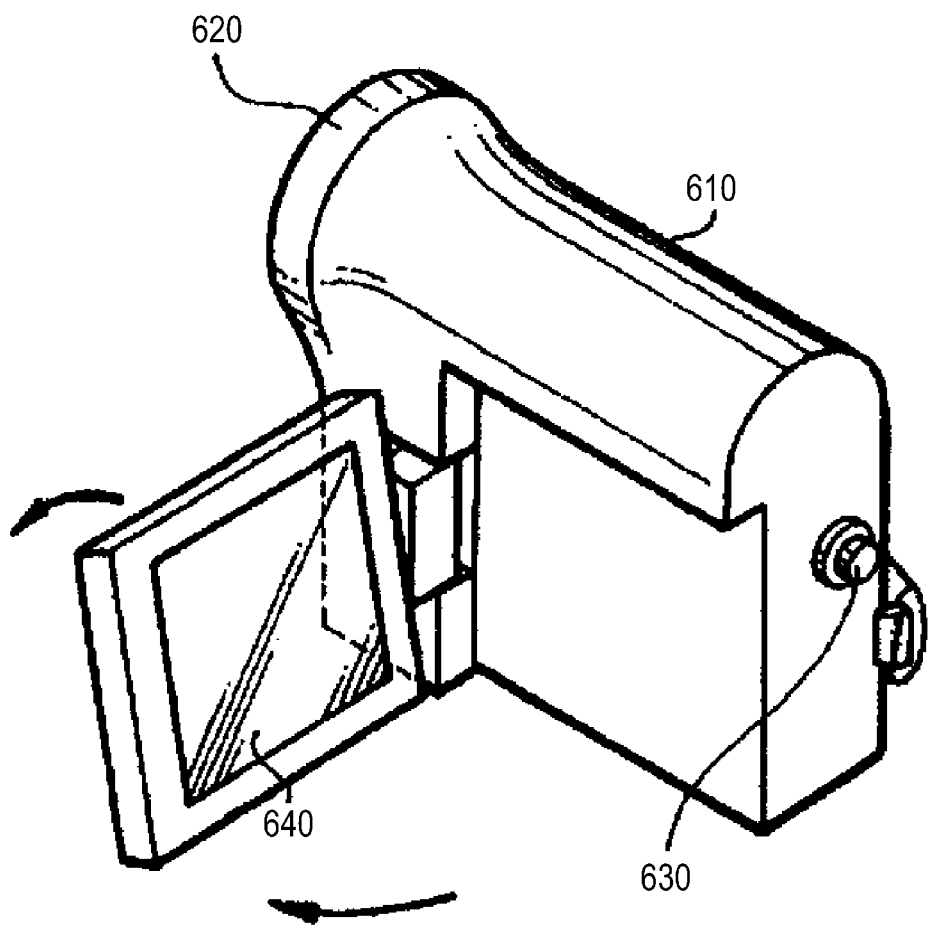
FIG. 25 is a perspective view showing an appearance of an application example 4.

FIG. 25 shows an appearance of a video camera to which the display devices 1 and 2 are applied. The video camera includes, for example, a main body 610, a lens 620 for imaging an object provided on the front side surface of the main body 610, a start/stop switch 630 used at the time of imaging and a display unit 640, the display unit 640 is configured by the display device 1 or 2.

[Application Example 5]

FIGS. 26A to 26G show an appearance of a cellular phone device to which the display devices 1 and 2 are applied. The cellular phone device includes, for example, an upper casing 710 and a lower casing 720 connected by a connection unit (hinge portion) 730, a display 740, a sub-display 750, a picture light 760 and a camera 770. The display 740 or the sub-display 750 are configured by the display device 1 or 2.

The present disclosure has been explained by citing respective embodiments and the application examples as described above, however, the present disclosure is not limited to them and various modifications are possible.

For example, the case in which the display device is an active-matrix type has been explained in the above embodiment, however, the configuration of the pixel circuit 12 for active-matrix driving is not limited to the configuration explained in the above embodiments and so on. Therefore, it is possible to add a capacitor device or a transistor to the pixel circuit 12 if necessary. In that case, necessary drive circuits can be added in addition to the above timing generation circuit 21, the video signal processing circuit 22, the data line drive circuit 23, the gate line drive circuit 24, the drain line drive circuit 25, the cathode line drive circuit 26, the detection circuit 27 and the contact position detection circuit 28 in accordance with the change of the pixel circuit 12.

In the above embodiments and the like, driving of the video signal processing circuit 22, the data line drive circuit 23, the gate line drive circuit 24, the drain line drive circuit 25, the cathode line drive circuit 26, the detection circuit 27 and the contact position detection circuit 28 is controlled by the timing generation circuit 21 and the video signal processing circuit 22, however, other circuits can control the driving. Additionally, the control of the video signal processing circuit 22, the data line drive circuit 23, the gate line drive circuit 24, the drain line drive circuit 25, the cathode line drive circuit 26, the detection circuit 27 and the contact position detection circuit 28 can be performed by hardware (circuits) as well as by software (programs).

Also in the above embodiments and the like, the source and the drain of the write transistor Tws as well as the source and the drain of the drive transistor Tdr are explained as the fixed state, however, it goes without saying that the facing state between the source and the drain may be reversed to the above explanation according to the direction in which electric current flows.

Further in the above embodiments and the like, the write transistor Tws and the drive transistor Tdr are explained to be formed by an n-channel MOS TFT, however, at least one of the write transistor Tws and the drive transistor Tdr may be formed by a p-channel MOS TFT. When the drive transistor Tdr is formed by the p-channel MOS TFT, the anode of the organic EL device 11 will be the cathode and the cathode of the organic EL device 11 will be the anode in the above embodiments and so on. Additionally, it is not always necessary that the write transistor Tws and the drive transistor Tdr are an amorphous silicon TFT or a micro silicon TFT, and for example, may be a low-temperature polysilicon TFT.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display panel, comprising:
plural display pixels arranged in a matrix state;
wherein each display pixel includes an organic EL device, a pixel circuit driving the organic EL device; and
the organic EL device is formed by stacking a first electrode connected to the pixel circuit, a light emitting layer, and a second electrode;
the first electrode is a cathode line, and is in contact with the light emitting layer;
the second electrode is a strip electrode shared by plural organic EL devices arranged in a row direction or in a column direction, wherein the second electrode is in contact with the light emitting layer; and
plural detection electrodes are provided on the display pixels on a side of the organic EL device second electrode as a plurality of strips so as to extend in a direction intersecting with the second electrode,
wherein the first electrode, the second electrode, and the detection electrodes occupy different layers of the display panel,
wherein at least one of the plural detection electrodes is separated from the second electrode of the organic EL device by at least a first insulating layer,
wherein the first electrode of the organic EL device is separated from the second electrode of the organic EL device by at least the light emitting layer,
wherein the detection electrodes are closer to a video display surface of the display panel than the second electrode,
wherein the second electrode is closer to the video display surface of the display panel than the first electrode,
wherein the detection electrodes are not positioned directly above the organic EL devices,
wherein first and second detection electrodes included in the plural detection electrodes extend parallel to first and second sides of a plurality of the organic EL devices,
wherein at least one of the plural detection electrodes cooperates with the second electrode to detect a contact position of an object, and
wherein the first electrode cooperates with the second electrode to generate an emission of light from the organic EL device.

2. The display panel of claim 1, wherein the second electrode includes a concave surface on a side facing the video display surface of the display panel.

3. The display panel of claim 2, wherein the light emitting layer includes a concave surface corresponding to the concave surface of the second electrode.

4. The display panel of claim 3, wherein the light emitting layer is provided in an opening in an insulating layer.

5. A display device comprising:
a display panel; and
a drive circuit driving the display panel,
wherein the display panel includes plural display pixels arranged in a matrix state,
each display pixel includes an organic EL device and a pixel circuit driving the organic EL device,
the organic EL device is formed by stacking a first electrode connected to the pixel circuit, a light emitting layer, and a second electrode,
the first electrode is a cathode line, and is in contact with the light emitting layer,
the second electrode is a strip electrode shared by plural organic EL devices arranged in a row direction or in a column direction, wherein the second electrode is in contact with the light emitting layer,
the display panel includes plural detection electrodes provided so as to extend in a direction intersecting with the strip electrode,
wherein the first electrode, the second electrode, and at least one of the detection electrodes occupy different layers of the display panel,
wherein at least one of the plural detection electrodes is separated from the second electrode of the organic EL device by at least a first insulating layer,
wherein the first electrode of the organic EL device is separated from the second electrode of the organic EL device by at least the light emitting layer,
wherein the detection electrodes are closer to a video display surface of the display panel than the second electrode,
wherein the second electrode is closer to the video display surface of the display panel than the first electrode,
wherein the detection electrodes are not positioned directly above the organic EL devices,
wherein first and second detection electrodes included in the plural detection electrodes extend parallel to first and second sides of a plurality of the organic EL devices, wherein at least one detection electrode in the plural detection electrodes cooperates with the second electrode to detect a contact position of an object,
wherein the first electrode cooperates with the second electrode to generate an emission of light from the organic EL device, and
wherein the drive circuit sequentially scans the plural strip electrodes during a non-light emitting period to perform a touch detection operation.

6. The display device according to claim 5,
wherein the drive circuit includes a contact position detection circuit detecting a contact position of an object based on variation of electric current flowing in the strip electrode.

7. The display device according to claim 6,
wherein the contact position detection circuit includes:
a current detection unit detecting electric current flowing in the strip electrode,
a current calculation unit deriving electric current at the time of a non-contact state based on a video signal, and
a contact position calculation unit deriving contact position information based on a current value detected by the current detection unit and a current value derived by the current calculation unit.

8. The display device according to claim 7,
wherein the pixel circuit includes a storage capacitor, a first transistor writing a voltage corresponding to a video signal into the storage capacitor and a second transistor driving the organic EL device based on the voltage of the storage capacitor, and
the first transistor is arranged at a position on which external light is incident.

9. The display device according to claim 6,
wherein the display panel includes a light shielding layer for shielding external light incident on the pixel circuit.

10. An electronic apparatus comprising:
a display device,
wherein the display device includes
a display panel and
a drive circuit driving the display panel,
in which the display panel includes plural display pixels arranged in a matrix state,
each display pixel includes an organic EL device and a pixel circuit driving the organic EL device,
the organic EL device is formed by stacking a first electrode connected to the pixel circuit, a light emitting layer, and a second electrode, wherein the first electrode is a cathode line, and is in contact with the light emitting layer, wherein the second electrode is a strip electrode shared by plural organic EL devices arranged in a row direction or in a column direction, and wherein the second electrode is in contact with the light emitting layer,
the display panel includes plural detection electrodes provided so as to extend in a direction intersecting with the strip electrode,
wherein the first electrode, the second electrode and at least one of the detection electrodes occupy different layers of the display panel,
wherein at least one of the plural detection electrodes is separated from the second electrode of the organic EL device by at least a first insulating layer,
wherein the first electrode of the organic EL device is separated from the second electrode of the organic EL device by at least the light emitting layer,
wherein the detection electrodes are not positioned directly above the organic EL devices,
wherein the detection electrodes are closer to a video display surface of the display panel than the second electrode,
wherein the second electrode is closer to the video display surface of the display panel than the first electrode,
wherein at least one detection electrode in the plurality of detection electrodes cooperates with the second electrode to detect a contact position of an object, and
wherein the first electrode cooperates with the second electrode to generate an emission of light from the organic EL device, and
the drive circuit sequentially scans the plural strip electrodes during a non-light emitting period.

* * * * *